(12) United States Patent
Sugimoto et al.

(10) Patent No.: US 12,136,893 B2
(45) Date of Patent: Nov. 5, 2024

(54) OPTICAL DEVICE HAVING FIXED AND MOVABLE COMB ELECTRODES

(71) Applicant: HAMAMATSU PHOTONICS K.K., Hamamatsu (JP)

(72) Inventors: Tatsuya Sugimoto, Hamamatsu (JP); Tomofumi Suzuki, Hamamatsu (JP); Kyosuke Kotani, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 532 days.

(21) Appl. No.: 16/625,687

(22) PCT Filed: Jul. 6, 2018

(86) PCT No.: PCT/JP2018/025638
§ 371 (c)(1),
(2) Date: Dec. 21, 2019

(87) PCT Pub. No.: WO2019/009396
PCT Pub. Date: Jan. 10, 2019

(65) Prior Publication Data
US 2021/0130159 A1    May 6, 2021

(30) Foreign Application Priority Data

Jul. 6, 2017   (JP) .................................. 2017-133093
Nov. 15, 2017  (JP) .................................. 2017-220237
(Continued)

(51) Int. Cl.
*G02B 26/08*   (2006.01)
*H02N 1/00*    (2006.01)

(52) U.S. Cl.
CPC ......... *H02N 1/008* (2013.01); *G02B 26/0841* (2013.01)

(58) Field of Classification Search
CPC ............................ G02B 26/0841; H02N 1/008
(Continued)

(56) References Cited

U.S. PATENT DOCUMENTS 6,507,138 B1    1/2003  Rodgers et al.
6,541,831 B2*   4/2003  Lee .................... G02B 26/0841
                                                257/417
(Continued)

FOREIGN PATENT DOCUMENTS

CN    1619351 A    5/2005
CN    1650214 A    8/2005
(Continued)

OTHER PUBLICATIONS

Akin Aydemir et al., "A new design and a fabrication approach to realize a high performance three axes capacitive MEMS accelerometer", Sensors and Actuators A Physical, vol. 244, Jun. 15, 2016, p. 324-p. 333.
(Continued)

*Primary Examiner* — Zachary W Wilkes
(74) *Attorney, Agent, or Firm* — Faegre Drinker Biddle & Reath LLP

(57) ABSTRACT

An optical device includes a base that includes a main surface, a movable unit that includes an optical function unit, an elastic support unit that supports the movable unit so that the movable unit is movable along a predetermined direction perpendicular to the main surface, a fixed comb electrode that includes a plurality of fixed comb fingers, and a movable comb electrode that includes a plurality of movable comb fingers which are disposed alternately with the plurality of fixed comb fingers. At least one of the movable unit and the elastic support unit includes an electrode support portion that supports the movable comb electrode. The electrode support portion includes a rib portion
(Continued)

that is formed so that the thickness of the electrode support portion in the predetermined direction is larger than the thickness of the movable comb fingers in the predetermined direction.

14 Claims, 11 Drawing Sheets

(30) Foreign Application Priority Data

| Dec. 7, 2017 | (JP) | ................. | 2017-235021 |
|---|---|---|---|
| Dec. 7, 2017 | (JP) | ................. | 2017-235022 |
| Dec. 7, 2017 | (JP) | ................. | 2017-235025 |
| Apr. 19, 2018 | (JP) | ................. | 2018-080743 |

(58) Field of Classification Search
USPC .......................................... 351/223.1, 224.1
See application file for complete search history.

(56) References Cited

U.S. PATENT DOCUMENTS

| 7,699,296 | B1 | 4/2010 | Knollenberg et al. | |
|---|---|---|---|---|
| 8,165,323 | B2* | 4/2012 | Zhou | H04R 19/005 |
| | | | | 381/174 |
| 8,353,600 | B1 | 1/2013 | Fu | |
| 8,729,770 | B1 | 5/2014 | Milanovic | |
| 11,187,872 | B2 | 11/2021 | Sugimoto et al. | |
| 11,635,613 | B2* | 4/2023 | Sugimoto | G02B 26/0841 |
| | | | | 359/221.2 |
| 11,693,230 | B2* | 7/2023 | Sugimoto | G02B 26/0841 |
| | | | | 359/221.2 |
| 2001/0044165 | A1* | 11/2001 | Lee | G02B 26/0841 |
| | | | | 438/52 |
| 2002/0109894 | A1 | 8/2002 | Clark et al. | |
| 2004/0004775 | A1 | 1/2004 | Turner et al. | |
| 2004/0081391 | A1 | 4/2004 | Ko et al. | |
| 2004/0184135 | A1 | 9/2004 | Miles et al. | |
| 2004/0232107 | A1 | 11/2004 | Kouma et al. | |
| 2005/0099665 | A1 | 5/2005 | Lee et al. | |
| 2005/0194650 | A1 | 9/2005 | Hung | |
| 2005/0194840 | A1 | 9/2005 | Mori et al. | |
| 2006/0082250 | A1* | 4/2006 | Ko | H02N 1/008 |
| | | | | 310/309 |
| 2008/0123242 | A1* | 5/2008 | Zhou | H01G 5/16 |
| | | | | 361/290 |
| 2008/0198249 | A1* | 8/2008 | Tanimura | H04N 5/2253 |
| | | | | 348/294 |
| 2008/0247029 | A1 | 10/2008 | Zhou | |
| 2008/0284078 | A1 | 11/2008 | Wolter et al. | |
| 2009/0107949 | A1 | 4/2009 | Kouma et al. | |
| 2009/0109512 | A1 | 4/2009 | Park | |
| 2009/0225387 | A1 | 9/2009 | Mizuno et al. | |
| 2010/0208347 | A1 | 8/2010 | Kouma et al. | |
| 2011/0080627 | A1 | 4/2011 | He et al. | |
| 2011/0090551 | A1 | 4/2011 | Pirk et al. | |
| 2011/0109194 | A1 | 5/2011 | Hung et al. | |
| 2011/0205608 | A1 | 8/2011 | Mizoguchi | |
| 2012/0099176 | A1 | 4/2012 | Zhou | |
| 2012/0160557 | A1 | 6/2012 | Yamada et al. | |
| 2012/0162739 | A1 | 6/2012 | Yamada | |
| 2012/0236382 | A1 | 9/2012 | Puegner et al. | |
| 2013/0083379 | A1 | 4/2013 | Tanaka et al. | |
| 2013/0194555 | A1 | 8/2013 | Davis et al. | |
| 2013/0321892 | A1 | 12/2013 | Haeberle et al. | |
| 2014/0125950 | A1 | 5/2014 | Shimada et al. | |
| 2014/0137670 | A1 | 5/2014 | Hata et al. | |
| 2014/0300942 | A1 | 10/2014 | Van Lierop et al. | |
| 2014/0327946 | A1 | 11/2014 | Van Lierop et al. | |
| 2014/0355091 | A1 | 12/2014 | Mizutani | |
| 2014/0362460 | A1 | 12/2014 | Nozu et al. | |
| 2015/0028698 | A1 | 1/2015 | Gutierrez | |
| 2015/0234176 | A1 | 8/2015 | Zhou | |
| 2016/0025964 | A1 | 1/2016 | Torayashiki et al. | |
| 2016/0202473 | A1 | 7/2016 | Uchino et al. | |
| 2016/0216508 | A1 | 7/2016 | Tamamori | |
| 2017/0139200 | A1 | 5/2017 | Chang et al. | |
| 2020/0363630 | A1* | 11/2020 | Sugimoto | G02B 26/0841 |
| 2021/0132367 | A1* | 5/2021 | Sugimoto | G02B 26/0841 |

FOREIGN PATENT DOCUMENTS

| CN | 1790181 | A | 6/2006 |
|---|---|---|---|
| CN | 1837892 | A | 9/2006 |
| CN | 101246258 | A | 8/2008 |
| CN | 101279708 | A | 10/2008 |
| CN | 101284642 | A | 10/2008 |
| CN | 101290395 | A | 10/2008 |
| CN | 101316789 | A | 12/2008 |
| CN | 101410744 | A | 4/2009 |
| CN | 101786592 | A | 7/2010 |
| CN | 101894711 | A | 11/2010 |
| CN | 102177465 | A | 9/2011 |
| CN | 102265033 | A | 11/2011 |
| CN | 102369153 | A | 3/2012 |
| CN | 102445752 | A | 5/2012 |
| CN | 102667497 | A | 9/2012 |
| CN | 102712460 | A | 10/2012 |
| CN | 102868383 | A | 1/2013 |
| CN | 103288034 | A | 9/2013 |
| CN | 103803478 | A | 5/2014 |
| CN | 203825034 | U | 9/2014 |
| CN | 104216109 | A | 12/2014 |
| CN | 104272167 | A | 1/2015 |
| CN | 104348326 | A | 2/2015 |
| CN | 104428439 | A | 3/2015 |
| CN | 104964678 | A | 10/2015 |
| CN | 105453408 | A | 3/2016 |
| CN | 105492879 | A | 4/2016 |
| CN | 105594114 | A | 5/2016 |
| CN | 105826252 | A | 8/2016 |
| CN | 105899995 | A | 8/2016 |
| CN | 106500682 | A | 3/2017 |
| CN | 106597016 | A | 4/2017 |
| CN | 106604887 | A | 4/2017 |
| CN | 106707415 | A | 5/2017 |
| EP | 1677086 | A1 | 7/2006 |
| EP | 3015901 | A1 | 5/2016 |
| EP | 3070508 | A1 | 9/2016 |
| JP | H1-295486 | A | 11/1989 |
| JP | H5-160545 | A | 6/1993 |
| JP | H8-506857 | A | 7/1996 |
| JP | 2000-214407 | A | 8/2000 |
| JP | 2002-524271 | A | 8/2002 |
| JP | 2002-326197 | A | 11/2002 |
| JP | 2003-029178 | A | 1/2003 |
| JP | 2004-177543 | A | 6/2004 |
| JP | 2004-215534 | A | 8/2004 |
| JP | 2004-325578 | A | 11/2004 |
| JP | 2005-010453 | A | 1/2005 |
| JP | 2005-275198 | A | 10/2005 |
| JP | 2006-343481 | A | 12/2006 |
| JP | 2007-155965 | A | 6/2007 |
| JP | 2007-183400 | A | 7/2007 |
| JP | 2007-188073 | A | 7/2007 |
| JP | 2008-055516 | A | 3/2008 |
| JP | 2008-083122 | A | 4/2008 |
| JP | 2008-285409 | A | 11/2008 |
| JP | 2009-171394 | A | 7/2009 |
| JP | 2010-008611 | A | 1/2010 |
| JP | 2010-029976 | A | 2/2010 |
| JP | 2010-054944 | A | 3/2010 |
| JP | 2010-085506 | A | 4/2010 |
| JP | 2010-128116 | A | 6/2010 |
| JP | 2010-184334 | A | 8/2010 |
| JP | 2011-069954 | A | 4/2011 |
| JP | 2011-175044 | A | 9/2011 |
| JP | 2012-042666 | A | 3/2012 |
| JP | 2012-108165 | A | 6/2012 |
| JP | 2012-133242 | A | 7/2012 |
| JP | 2012-184962 | A | 9/2012 |
| JP | 2012-198298 | A | 10/2012 |

(56) References Cited

FOREIGN PATENT DOCUMENTS

| | | |
|---|---|---|
| JP | 2012-524295 A | 10/2012 |
| JP | 2012-528343 A | 11/2012 |
| JP | 2013-009447 A | 1/2013 |
| JP | 2013-016651 A | 1/2013 |
| JP | 2013-080068 A | 5/2013 |
| JP | 2013-148707 A | 8/2013 |
| JP | 2014-006418 A | 1/2014 |
| JP | 2014-023207 A | 2/2014 |
| JP | 2014-035429 A | 2/2014 |
| JP | 2014-115267 A | 6/2014 |
| JP | 2014-215534 A | 11/2014 |
| JP | 2014-235260 A | 12/2014 |
| JP | 2014-238581 A | 12/2014 |
| JP | 2015-093340 A | 5/2015 |
| JP | 2015-102483 A | 6/2015 |
| JP | 2015-102709 A | 6/2015 |
| JP | 2015-219516 A | 12/2015 |
| JP | 2016-085299 A | 5/2016 |
| JP | 2016-114798 A | 6/2016 |
| JP | 2016-151681 A | 8/2016 |
| JP | 2016-200834 A | 12/2016 |
| JP | 2016-212221 A | 12/2016 |
| JP | 2017-058418 A | 3/2017 |
| JP | 2017-070163 A | 4/2017 |
| JP | 2017-129783 A | 7/2017 |
| TW | 201531709 A | 8/2015 |
| TW | I563290 B | 12/2016 |
| TW | 201717371 A | 5/2017 |
| TW | 201718896 A | 6/2017 |
| TW | I588533 B | 6/2017 |
| WO | WO 94/018697 A1 | 8/1994 |
| WO | WO-00/013210 A2 | 3/2000 |
| WO | WO 2009/124607 A1 | 10/2009 |
| WO | WO-2010/121185 A1 | 10/2010 |
| WO | WO-2010/136358 A2 | 12/2010 |
| WO | WO 2011/091012 A2 | 7/2011 |
| WO | WO-2013/046612 A1 | 4/2013 |
| WO | WO 2015/068400 A1 | 5/2015 |
| WO | WO 2016/002453 A1 | 1/2016 |

OTHER PUBLICATIONS

English-language translation of International Preliminary Report on Patentability (IPRP) dated May 28, 2020 that issued in WO Patent Application No. PCT/JP2018/029117.
An EP Search Report dated Aug. 16, 2021 from a counterpart, related, or other application and having documents cited thereon is attached for the Examiner's consideration.
English-language translation of International Preliminary Report on Patentability (IPRP) dated May 28, 2020 that issued in WO Patent Application No. PCT/JP2018/032760.
Sun Fengming et al., "MEMS Based Micro Displacement Sensor and Its Application", Chinese Journal of Sensors and Actuators, vol. 26, No. 2, Feb. 2013, p. 293-p. 296.
Sandner Thilo et al., "Translatory MEMS actuator and their system integration for miniaturized Fourier transform spectrometers", MOEMS and Miniaturized Systems XI, SPIE, 1000 20th St. Bellingham WA 98225-6705 USA, vol. 8252, No. 1, Mar. 8, 2012, p. 1-p. 10, XP060023646.
Sandner, Thilo et al., "Out-of-plane translatory MEMS actuator with extraordinary large stroke for optical path length modulation in miniaturized FTIR Spectrometers," Sensor+Test Conferences 2011, Proceedings IRS2, Jun. 9, 2011, p. 151-p. 156.
International Preliminary Report on Patentability mailed Jan. 16, 2020 for PCT/JP2018/025638.
International Preliminary Report on Patentability mailed Jan. 16, 2020 for PCT/JP2018/025635.
International Preliminary Report on Patentability mailed Jan. 16, 2020 for PCT/JP2018/025637.
International Preliminary Report on Patentability mailed Jan. 16, 2020 for PCT/JP2018/025640.
International Preliminary Report on Patentability mailed Jan. 16, 2020 for PCT/JP2018/025634.
International Preliminary Report on Patentability mailed Jan. 16, 2020 for PCT/JP2018/025636.
International Preliminary Report on Patentability mailed Jan. 16, 2020 for PCT/JP2018/025639.
Anonymous, "Michelson Interferometer—Definition and Applications", URL:https://www.azooptics.com/Article.aspx?ArticleID=698 , May 6, 2014, XP093017159.

* cited by examiner

OPTICAL DEVICE HAVING FIXED AND MOVABLE COMB ELECTRODES

TECHNICAL FIELD

The present disclosure relates to an optical device that is constituted, for example, as a micro electro mechanical systems (MEMS) device.

BACKGROUND ART

As the MEMS device, an optical device including a base, a movable unit including an optical function unit, and an elastic support unit that is connected between the base and the movable unit and supports the movable unit so that the movable unit is movable along a movement direction is known (for example, refer to Patent Literature 1). The optical device includes a movable comb electrode including a plurality of movable comb fingers, and a fixed comb electrode including a plurality of fixed comb fingers which are disposed alternately with the plurality of movable comb fingers in some cases.

CITATION LIST

Patent Literature

Patent Literature 1: US Unexamined Patent Publication No. 2008/0284078

SUMMARY OF INVENTION

Technical Problem

The movable comb electrode and the fixed comb electrode can be used as an electrode for driving, an electrode for monitoring, or an electrode for driving and monitoring. In a case where the movable comb electrode and the fixed comb electrode can be used as the electrode for driving, a voltage is applied to between the movable comb electrode and the fixed comb electrode to move the movable unit along a movement direction. In a case where the movable comb electrode and the fixed comb electrode can be used as the electrode for monitoring, electrostatic capacitance between the movable comb electrode and the fixed comb electrode is detected to understand a position of the movable unit that is moving along the movement direction.

In a case where the movable comb electrode and the fixed comb electrode are used for either usage, it is preferable that the movable comb electrode moves integrally with the movable unit during movement of the movable unit along the movement direction, and an interval between the movable comb finger and the fixed comb finger adjacent to each other is constantly maintained. However, if the movable comb electrode and the fixed comb electrode are merely provided, the movable comb electrode is distorted during movement of the movable unit along the movement direction, and thus there is a concern that reliability as a device may deteriorate.

An object of an aspect of the present disclosure is to provide an optical device with high reliability.

Solution to Problem

According to an aspect of the present disclosure, there is provided an optical device including: a base that includes a main surface; a movable unit that includes an optical function unit; an elastic support unit that is connected between the base and the movable unit, and supports the movable unit so that the movable unit is movable along a predetermined direction perpendicular to the main surface; a fixed comb electrode that is provided to the base and includes a plurality of fixed comb forgers; and a movable comb electrode that is provided to at least one of the movable unit and the elastic support unit, and includes a plurality of movable comb fingers which are disposed alternately with the plurality of fixed comb fingers. At least one of the movable unit and the elastic support unit includes an electrode support portion that supports the movable comb electrode, and the electrode support portion includes a rib portion that is formed so that the thickness of the electrode support portion in the predetermined direction is larger than the thickness of the movable comb fingers in the predetermined direction.

In the optical device, since the rib portion is formed, the thickness of the electrode support portion in the predetermined direction is larger than the thickness of the movable comb fingers in the predetermined direction, and the movable comb electrode is supported by the electrode support portion. Accordingly, it is possible to suppress distortion of the electrode support portion that supports the movable comb electrode during movement of the movable unit along the predetermined direction. Accordingly, it is possible to move the movable comb electrode integrally with the movable unit, and it is possible to suppress fluctuation of an interval between the movable comb finger and the fixed comb finger adjacent to each other. As a result, it is possible to enhance reliability.

In the optical device according to the aspect of the present disclosure, the elastic support unit may include a lever, and the electrode support portion may extend from the lever. In this case, it is possible to suppress distortion of the movable comb electrode due to the electrode support portion that extends from the lever.

In the optical device according to the aspect of the present disclosure, the movable comb electrode may be located on a side opposite to the movable unit with respect to the center of the lever in an extending direction of the lever. In this case, even when the movable unit greatly moves along the predetermined direction, the movable comb fingers are less likely to deviate from a region between the fixed comb fingers adjacent to each other. Accordingly, in a case where the fixed comb electrode and the movable comb electrode can be used as an electrode for driving, it is possible to allow an electrostatic force to occur between the fixed comb electrode and the movable comb electrode over the entirety of a movable range of the movable unit. In addition, in a case where the fixed comb electrode and the movable comb electrode can be used as an electrode for monitoring, it is possible to detect a variation of electrostatic capacitance between the fixed comb electrode and the movable comb electrode over the entirety of the movable range of the movable unit.

In the optical device according to the aspect of the present disclosure, the movable comb electrode may be located on the movable unit side with respect to the center of the lever in an extending direction of the lever. In this case, it is possible to secure a distance from a connection position with respect to the base in the elastic support unit to the movable comb electrode. Accordingly, in a case where the fixed comb electrode and the movable comb electrode can be used as an electrode for driving, it is possible to use the electrostatic force that occurs between the fixed comb electrode and the movable comb electrode as a driving force of the movable unit with efficiency. In addition, in a case where the fixed comb electrode and the movable comb electrode can be used as an electrode for monitoring, a variation of the electrostatic capacitance between the fixed comb electrode and the movable comb electrode is great, and thus it is possible to easily and reliably detect a position of the movable unit.

In the optical device according to the aspect of the present disclosure, the lever may include a rib portion that is formed so that the thickness of the lever in the predetermined direction is larger than the thickness of the movable comb fingers in the predetermined direction. In this case, it is possible to more reliably suppress fluctuation of the interval between the movable comb finger and the fixed comb finger adjacent to each other, and it is possible to further improve the reliability.

In the optical device according to the aspect of the present disclosure, the elastic support unit may include a plurality of the electrode support portions which extend from the lever, and the plurality of electrode support portions may be disposed to be aligned along an extending direction of the lever. In this case, since the plurality of electrode support portions are provided to a case where the fixed comb electrode and the movable comb electrode can be used as an electrode for driving, it is possible to secure a driving force. In addition, in a case where the fixed comb electrode and the movable comb electrode can be used as an electrode for monitoring, it is possible to easily and reliably detect a position of the movable unit. In the optical device, distortion of the electrode support portion that supports the movable comb electrode is suppressed by increasing the thickness of the electrode support portion instead of a width thereof, and thus it is possible to dispose the plurality of electrode support portions to be aligned along an extending direction of the lever.

In the optical device according to the aspect of the present disclosure, the thickness T1 of the electrode support portion in the predetermined direction and the thickness T2 of the movable comb finger in the predetermined direction may satisfy the following Expression (1), $$T1^3 \times W1/C1^3 \geq N \times T2^3 \times W2/C2^3 \quad (1)$$

in Expression (1) described above, W1: a width of the electrode support portion when viewed from the predetermined direction, C1: a length of the electrode support portion when viewed from the predetermined direction, N: the number of the movable comb fingers, W2: a width of the movable comb finger when viewed from the predetermined direction, and C2: a length of the movable comb finger when viewed from the predetermined direction. In this case, it is possible to more reliably suppress distortion of the movable comb electrode.

In the optical device according to the aspect of the present disclosure, the electrode support portion may be provided to the movable unit to be disposed along an outer edge of the movable unit. In this case, it is possible to secure the distance from the connection position with respect to the base in the elastic support unit to the movable comb electrode. Accordingly, in a case where the fixed comb electrode and the movable comb electrode can be used as an electrode for driving, it is possible to use the electrostatic force that occurs between the fixed comb electrode and the movable comb electrode as the driving force of the movable unit with efficiency. In addition, in a case where the fixed comb electrode and the movable comb electrode can be used as an electrode for monitoring, the variation of the electrostatic capacitance between the fixed comb electrode and the movable comb electrode is great, and thus it is possible to easily and reliably detect the position of the movable unit.

In the optical device according to the aspect of the present disclosure, the movable unit may include a main body portion that is provided with the optical function unit, and a frame portion that surrounds the main body portion when viewed from the predetermined direction, and the electrode support portion may be constituted by the frame portion. In this case, it is possible to suppress fluctuation of the interval between the movable comb finger and the fixed comb finger adjacent to each other due to the frame portion that surrounds the main body portion.

In the optical device according to the aspect of the present disclosure, the movable unit may include a central portion provided with the optical function unit, and an outer edge portion of which the thickness in the predetermined direction is larger than the thickness of the central portion, and the electrode support portion may be constituted by the outer edge portion. In this case, it is possible to suppress fluctuation of the interval between the movable comb finger and the fixed comb finger adjacent to each other due to the outer edge portion of which the thickness in the predetermined direction is larger than the thickness of the central portion.

In the optical device according to the aspect of the present disclosure, the elastic support unit may include a pair of levers and a link that bridges the pair of levers, and the electrode support portion may be constituted by the link. In this case, it is possible to suppress fluctuation of the interval between the movable comb finger and the fixed comb finger adjacent to each other due to the link that bridges the pair of levers.

In the optical device according to the aspect of the present disclosure, the elastic support unit may include a pair of levers and a link that bridges the pair of levers, the electrode support portion may be constituted by the pair of levers and the link, and the movable comb electrode may be disposed across the pair of levers and the link. In this case, it is possible to suppress fluctuation of the interval between the movable comb finger and the fixed comb finger adjacent to each other due to the pair of levers and the link.

In the optical device according to the aspect of the present disclosure, the elastic support unit may include a lever, and an extending portion that extends between the lever and the movable unit when viewed from the predetermined direction, and the electrode support portion may be constituted by the extending portion. In this case, it is possible to suppress fluctuation of the interval between the movable comb finger and the fixed comb finger adjacent to each other due to the extending portion that extends between the lever and the movable unit when viewed from the predetermined direction.

In the optical device according to the aspect of the present disclosure, the elastic support unit may include a torsion support portion that extends in a second direction perpendicular to the predetermined direction, and a non-linearity mitigation spring that is connected between the torsion support portion and the movable unit, and the non-linearity mitigation spring may be constituted so that a deformation amount of the non-linearity mitigation spring around the second direction is smaller than a deformation amount of the torsion support portion around the second direction, and a deformation amount of the non-linearity mitigation spring in a third direction perpendicular to the predetermined direction and the second direction is larger than a deformation amount of the torsion support portion in the third direction in a state in which the movable unit has moved in the predetermined direction. In this case, it is possible to suppress non-linearity from occurring in twist deformation of the torsion support portion. In addition, in a configuration in which the non-linearity mitigation spring is provided, it is possible to suppress fluctuation of the interval between the movable comb finger and the fixed comb finger adjacent to each other.

Advantageous Effects of Invention

According to the aspect of the present disclosure, it is possible to provide an optical device with high reliability.

DESCRIPTION OF EMBODIMENTS

Figure 1:
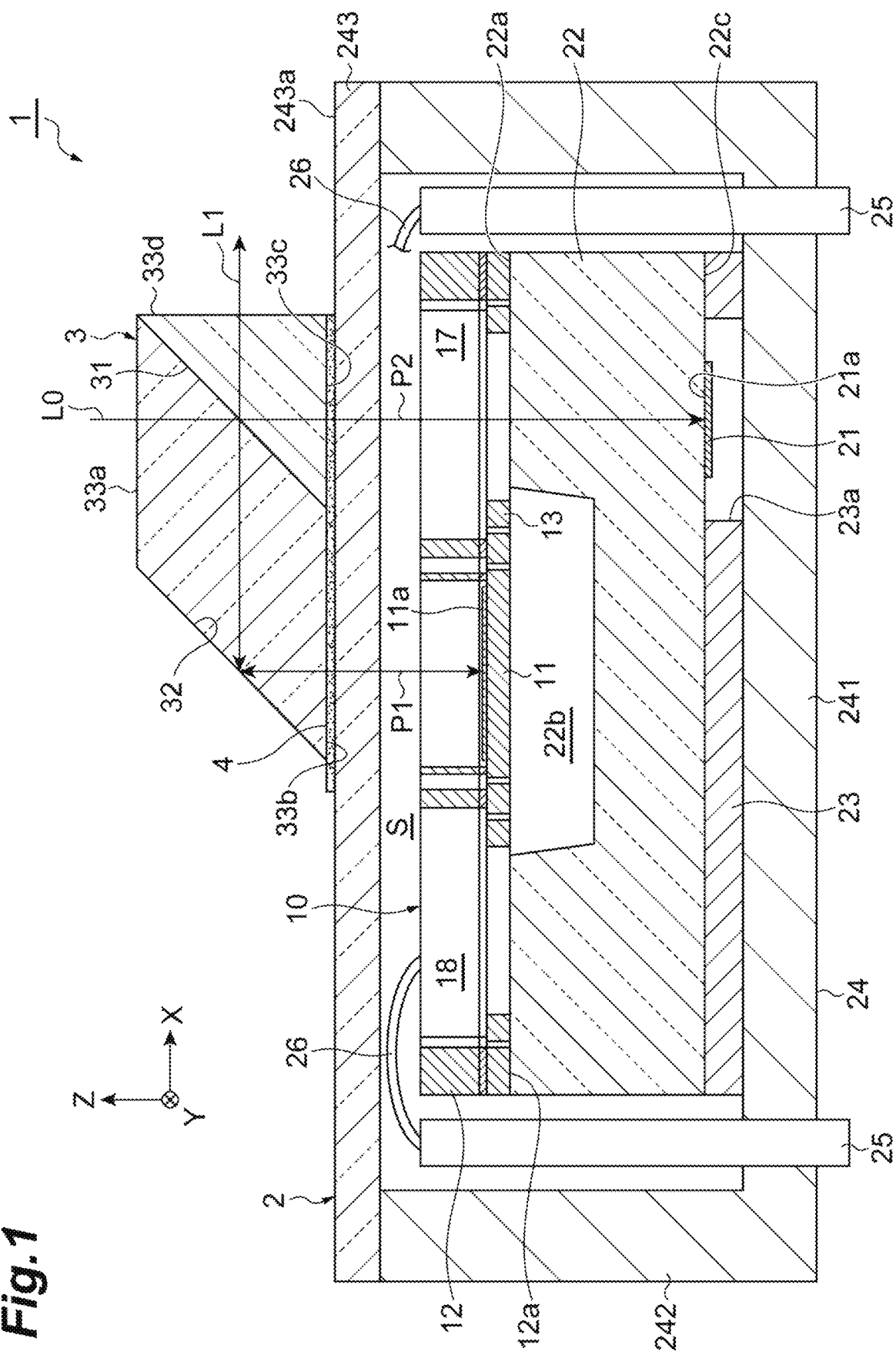
FIG. 1 is a vertical cross-sectional view of an optical module including an optical device according to an embodiment.

Hereinafter, an embodiment according to an aspect of the present disclosure will be described in detail with reference to the accompanying drawings. In the following description, the same reference numeral will be given to the same or equivalent parts in the respective drawings, and redundant description thereof will be omitted.
[Configuration of Optical Module]

As illustrated in FIG. 1, an optical module 1 includes a mirror unit 2 and a beam splitter unit 3. The mirror unit 2 includes an optical device 10 and a fixed mirror 21. The optical device 10 includes a movable mirror (movable unit) 11. In the optical module 1, an interference optical system is constituted by the beam splitter unit 3, the movable mirror 11, and the fixed mirror 21 with respect to measurement light L0. Here, the interference optical system is a Michelson interference optical system.

The optical device 10 includes a base 12, a drive unit 13, a first optical function unit 17, and a second optical function unit 18 in addition to the movable mirror 11. The base 12 includes a main surface 12a. The movable mirror 11 includes a mirror surface (optical function unit) 11a along a plane parallel to the main surface 12a. The movable mirror 11 is supported in the base 12 to be movable along a Z-axis direction (a direction parallel to a Z-axis, a predetermined direction) perpendicular to the main surface 12a. The drive unit 13 moves the movable mirror 11 along the Z-axis direction. The first optical function unit 17 is disposed on one side of the movable mirror 11 in an X-axis direction (a direction parallel to an X-axis, a third direction) perpendicular to the Z-axis direction when viewed from the Z-axis direction. The second optical function unit 18 is disposed on the other side of the movable mirror 11 in the X-axis direction when viewed from the Z-axis direction. The first optical function unit 17 and the second optical function unit 18 are light passage openings provided in the base 12, and are respectively opened to one side and the other side in the Z-axis direction. In the optical module 1, the second optical function unit 18 is not used as the light passage opening. In a case where the optical device 10 is applied to another device, at least one of the first optical function unit 17 and the second optical function unit 18 may be used as an optical function unit, or both the first optical function unit 17 and the second optical function unit 18 may not be used as the optical function unit.

The fixed mirror 21 includes a mirror surface 21a that extends along a plane (plane perpendicular to the Z-axis direction) parallel to the main surface 12a. A position of the fixed mirror 21 with respect to the base 12 is fixed. In the mirror unit 2, the mirror surface 11a of the movable mirror 11 and the mirror surface 21a of the fixed mirror 21 face one side (the beam splitter unit 3 side) in the Z-axis direction.

The mirror unit 2 includes a support 22, a sub-mount 23, and a package 24 in addition to the optical device 10 and the fixed mirror 21. The package 24 accommodates the optical device 10, the fixed mirror 21, the support 22, and the sub-mount 23. The package 24 includes a bottom wall 241, a side wall 242, and a ceiling wall 243. For example, the package 24 is formed in a rectangular parallelepiped box shape. For example, the package 24 has a size of approximately 30×25×10 (thickness) mm. The bottom wall 241 and the side wall 242 are integrally formed. The ceiling wall 243 faces the bottom wall 241 in the Z-axis direction, and is fixed to the side wall 242. The ceiling wall 243 has optical transparency with respect to the measurement light L0. In the mirror unit 2, a space S is formed by the package 24. For example, the space S is opened to the outside of the mirror unit 2 through a ventilation hole or a gap that is formed in the package 24. In a case where the space S is not an air-tight space as described above, it is possible to suppress contamination, hazing, or the like of the mirror surface 11a which is caused by an out-gas from a resin material that exists in the package 24, a moisture that exists in the package 24, or the like. The space S may be an air-tight space in which the degree of vacuum is maintained to be high, or an air-tight space filled with an inert gas such as nitrogen.

A support 22 is fixed to an inner surface of the bottom wall 241 through the sub-mount 23. For example, the support 22 is formed in a rectangular plate shape. The support 22 has optical transparency with respect to the measurement light L0. The base 12 of the optical device 10 is fixed to a surface 22a of the support 22 on a side opposite to the sub-mount 23. That is, the base 12 is supported by the support 22. A concave portion 22b is formed in the surface 22a of the support 22, and a gap (a part of the space S) is formed between the optical device 10 and the ceiling wall 243. Accordingly, when the movable mirror 11 is caused to move along the Z-axis direction, the movable mirror 11 and the drive unit 13 are prevented from coming into contact with the support 22 and the ceiling wall 243.

An opening 23a is formed in the sub-mount 23. The fixed mirror 21 is disposed on a surface 22c of the support 22 on the sub-mount 23 side to be located in the opening 23a. That is, the fixed mirror 21 is disposed on the surface 22c of the support 22 on a side opposite to the base 12. The fixed mirror 21 is disposed on one side of the movable mirror 11 in the X-axis direction when viewed from the Z-axis direction. The fixed mirror 21 overlaps the first optical function unit 17 of the optical device 10 when viewed from the Z-axis direction.

The mirror unit 2 further includes a plurality of lead pins 25 and a plurality of wires 26. The lead pins 25 are fixed to the bottom wall 241 in a state of penetrating the bottom wall 241. The lead pins 25 are electrically connected to the drive unit 13 through the wires 26. In the mirror unit 2, an electric signal for moving the movable mirror 11 along the Z-axis direction is applied to the drive unit 13 through the plurality of lead pins 25 and the plurality of wires 26.

The beam splitter unit 3 is supported by the ceiling wall 243 of the package 24. Specifically, the beam splitter unit 3 is fixed to a surface 243a of the ceiling wall 243 on a side opposite to the optical device 10 by an optical resin 4. The optical resin 4 has optical transparency with respect to the measurement light L0.

The beam splitter unit 3 includes, a half mirror surface 31, a total reflection mirror surface 32 and a plurality of optical surfaces 33a, 33b, 33c, and 33d. The beam splitter unit 3 is constituted by joining a plurality of optical blocks. For example, the half mirror surface 31 is formed by a dielectric multi-layer film. For example, the total reflection mirror surface 32 is formed by a metal film.

For example, the optical surface 33a is a surface that is perpendicular to the Z-axis direction, and overlaps the first optical function unit 17 of the optical device 10 and the mirror surface 21a of the fixed mirror 21 when viewed from the Z-axis direction. The optical surface 33a allows the measurement light L0 incident along the Z-axis direction to be transmitted therethrough.

For example, the half mirror surface 31 is a surface that is inclined at an angle of 45° with respect to the optical surface 33a, and overlaps the first optical function unit 17 of the optical device 10 and the mirror surface 21a of the fixed mirror 21 when viewed from the Z-axis direction. The half mirror surface 31 reflects a part of the measurement light L0, which is incident to the optical surface 33a along the Z-axis direction, along the X-axis direction, and allows the remainder of the measurement light L0 to be transmitted therethrough toward the fixed mirror 21 side along the Z-axis direction.

The total reflection mirror surface 32 is a surface that is parallel to the half mirror surface 31, overlaps the mirror surface 11a of the movable mirror 11 when viewed from the Z-axis direction, and overlaps the half mirror surface 31 when viewed from the X-axis direction. The total reflection mirror surface 32 reflects the part of the measurement light L0 which is reflected by the half mirror surface 31 toward the movable mirror 11 side along the Z-axis direction.

The optical surface 33b is a surface that is parallel to the optical surface 33a, and overlaps the mirror surface 11a of the movable mirror 11 when viewed from the Z-axis direction. The optical surface 33b allows the part of the measurement light L0 which is reflected by the total reflection mirror surface 32 to be transmitted therethrough toward the movable mirror 11 side along the Z-axis direction.

The optical surface 33c is a surface that is parallel to the optical surface 33a, and overlaps the mirror surface 21a of the fixed mirror 21 when viewed from the Z-axis direction. The optical surface 33c allows the remainder of the measurement light L0 which is transmitted through the half mirror surface 31 to be transmitted therethrough toward the fixed mirror 21 side along the Z-axis direction.

For example, the optical surface 33d is a surface that is perpendicular to the X-axis direction, and overlaps the half mirror surface 31 and the total reflection mirror surface 32 when viewed from the X-axis direction. The optical surface 33d allows measurement light L1 to be transmitted therethrough along the X-axis direction. The measurement light L1 is interference light of the part of the measurement light L0 which is sequentially reflected by the mirror surface 11a of the movable mirror 11 and the total reflection mirror surface 32 and is transmitted through the half mirror surface 31, and the remainder of the measurement light L0 which is sequentially reflected by the mirror surface 21a of the fixed mirror 21 and the half mirror surface 31.

In the optical module 1 constituted as described above, when the measurement light L0 is incident to the beam splitter unit 3 from the outside of the optical module 1 through the optical surface 33a, a part of the measurement light L0 is sequentially reflected by the half mirror surface 31 and the total reflection mirror surface 32, and proceeds through the mirror surface 11a of the movable mirror 11. In addition, the part of the measurement light L0 is reflected by the mirror surface 11a of the movable mirror 11, proceeds on the same optical path (an optical path P1 to be described later) in an opposite direction, and is transmitted through the half mirror surface 31 of the beam splitter unit 3.

On the other hand, the remainder of the measurement light L0 is transmitted through the half mirror surface 31 of the beam splitter unit 3, passes through the first optical function unit 17, is transmitted through the support 22, and proceeds toward the mirror surface 21a of the fixed mirror 21. In addition, the remainder of the measurement light L0 is reflected by the mirror surface 21a of the fixed mirror 21, proceeds on the same optical path (an optical path P2 to be described later) in an opposite direction, and is reflected by the half mirror surface 31 of the beam splitter unit 3.

The part of the measurement light L0 which is transmitted through the half mirror surface 31 of the beam splitter unit 3, and the remainder of the measurement light L0 which is reflected by the half mirror surface 31 of the beam splitter unit 3 become the measurement light L1 that is interference light, and the measurement light L1 is emitted from the beam splitter unit 3 to the outside of the optical module 1 through the optical surface 33d. According to the optical module 1, it is possible to reciprocate the movable mirror 11 at a high speed along the Z-axis direction, and thus it is possible to provide a small-sized high-accuracy Fourier transformation type infrared spectral analyzer (FTIR).

The support 22 corrects an optical path difference between the optical path P1 between the beam splitter unit 3 and the movable mirror 11, and the optical path P2 between the beam splitter unit 3 and the fixed mirror 21. Specifically, the optical path P1 is an optical path ranging from the half mirror surface 31 to the mirror surface 11a of the movable mirror 11 which is located at a reference position with the total reflection mirror surface 32 and the optical surface 33b sequentially interposed therebetween, and is an optical path along which the part of the measurement light L0 proceeds. The optical path P2 is an optical path ranging from the half mirror surface 31 to the mirror surface 21a of the fixed mirror 21 with the optical surface 33c and the first optical function unit 17 sequentially interposed therebetween, and is an optical path through which the remainder of the measurement light L0 proceeds. The support 22 corrects the optical path difference between the optical path P1 and the optical path P2 so that a difference between an optical path length of the optical path P1 (an optical path length in consideration of a refractive index of each medium through which the optical path P1 passes), and an optical path length of the optical path P2 (an optical path length in consideration of a refractive index of each medium through which the optical path P2 passes) decreases (for example, disappears). For example, the support 22 can be formed by the same light-transmitting material as in the optical blocks which constitute the beam splitter unit 3. In this case, the thickness of the support 22 (a length in the Z-axis direction) can be set to be the same as a distance between the half mirror surface 31 and the total reflection mirror surface 32 in the X-axis direction.

[Configuration of Optical Device]

As illustrated in FIG. 2 to FIG. 6, a portion of the movable mirror 11 excluding the mirror surface 11a, the base 12, the drive unit 13, the first optical function unit 17, and the second optical function unit 18 are constituted by a silicon on insulator (SOI) substrate 50. That is, the optical device 10 is constituted by the SOI substrate 50. For example, the optical device 10 is formed in a rectangular plate shape. For example, the optical device 10 has a size of approximately 15×10×0.3 (thickness) mm. The SOI substrate 50 includes a support layer 51, a device layer 52, and an intermediate layer 53. The support layer 51 is a first silicon layer. The device layer 52 is a second silicon layer. The intermediate layer 53 is an insulating layer that is disposed between the support layer 51 and the device layer 52.

The base 12 is formed at a part of the support layer 51, the device layer 52, and the intermediate layer 53. The main surface 12a of the base 12 is a surface of the device layer 52 on a side opposite to the intermediate layer 53. A main surface 12b of the base 12 on a side opposite to the main surface 12a is a surface of the support layer 51 on a side opposite to the intermediate layer 53. In the optical module 1, the main surface 12a of the base 12 and the surface 22a of the support 22 are joined to each other (refer to FIG. 1).

The movable mirror 11 is disposed in a state in which an intersection between an axial line R1 and an axial line R2 is set as the central position (gravity center position). The axial line R1 is a straight line that extends in the X-axis direction. The axial line R2 is a straight line that extends in a Y-axis direction (a direction parallel to a Y-axis, a second direction) that is perpendicular to the X-axis direction and the Z-axis direction. The optical device 10 has a shape that is linearly symmetric to each of the axial line R1 and the axial line R2 when viewed from the Z-axis direction.

The movable mirror 11 includes a main body portion 111, a frame portion 112 (electrode support portion), and a pair of connection portions 113. The main body portion 111 has a circular shape when viewed from the Z-axis direction. The main body portion 111 includes a central portion 114 and an outer edge portion 115. For example, the mirror surface 11a having a circular shape is provided on a surface of the central portion 114 on the main surface 12b side by forming a metal film thereon. The central portion 114 is formed by a part of the device layer 52. The outer edge portion 115 surrounds the central portion 114 when viewed from the Z-axis direction. The outer edge portion 115 includes a first main body portion 115a and a first rib portion 115b. The first main body portion 115a is formed by a part of the device layer 52.

The first rib portion 115b is formed at a part of the support layer 51 and the intermediate layer 53. The first rib portion 115b is provided on a surface of the first main body portion 115a on the main surface 12b side. The first rib portion 115b is formed so that the thickness of the outer edge portion 115 in the Z-axis direction is larger than the thickness of the central portion 114 in the Z-axis direction. The first rib portion 115b has a circular ring shape when viewed from the Z-axis direction, and surrounds the mirror surface 11a. The first rib portion 115b extends along an outer edge of the main body portion 111 when viewed from the Z-axis direction. In this embodiment, an outer edge of the first rib portion 115b extends along the outer edge of the main body portion 111 with a predetermined interval from the outer edge of the main body portion 111 when viewed from the Z-axis direction. An inner edge of the first rib portion 115b extends along an outer edge of the mirror surface 11a with a predetermined interval from the outer edge of the mirror surface 11a when viewed from the Z-axis direction.

The frame portion 112 surrounds the main body portion 111 with a predetermined interval from the main body portion 111 when viewed from the Z-axis direction. The frame portion 112 has a circular ring shape when viewed from the Z-axis direction. The frame portion 112 is disposed along the outer edge of the movable mirror 11 (to constitute the outer edge of the movable mirror 11). The frame portion 112 includes a second main body portion 112a and a second rib portion 112b. The second main body portion 112a is formed by a part of the device layer 52.

The second rib portion 112b is formed by a part of the support layer 51 and the intermediate layer 53. The second rib portion 112b is provided on a surface of the second main body portion 112a on the main surface 12b side. The second rib portion 112b is formed so that the thickness of the frame portion 112 in the Z-axis direction is larger than the thickness of the central portion 114 in the Z-axis direction. The second rib portion 112b has a circular ring shape when viewed from the Z-axis direction. An outer edge of the second rib portion 112b extends along an outer edge of the frame portion 112 with a predetermined interval from the outer edge of the frame portion 112 when viewed from the Z-axis direction. An inner edge of the second rib portion 112b extends along an inner edge of the frame portion 112 with a predetermined interval from the inner edge of the frame portion 112 when viewed from the Z-axis direction.

The thickness of the second rib portion 112b in the Z-axis direction is the same as the thickness of the first rib portion 115b in the Z-axis direction. A width of the second rib portion 112b is wider than a width of the first rib portion 115b when viewed from the Z-axis direction. The width of the first rib portion 115b when viewed from the Z-axis direction is a length of the first rib portion 115b in a direction that is perpendicular to an extending direction of the first rib portion 115b, and is a length of the first rib portion 115b in a radial direction of the first rib portion 115b in this embodiment. This is also true of a width of the second rib portion 112b when viewed from the Z-axis direction.

The pair of connection portions 113 connect the main body portion 111 and the frame portion 112. The pair of connection portions 113 are respectively disposed on one side and on the other side in the Y-axis direction with respect to the main body portion 111. Each of the connection portions 113 includes a third main body portion 113a and a third rib portion 113b. The third main body portion 113a is formed by a part of the device layer 52. The third main body portion 113a is connected to the first main body portion 115a and the second main body portion 112a.

The third rib portion 113b is formed by a part of the support layer 51 and the intermediate layer 53. The third rib portion 113b is connected to the first rib portion 115b and the second rib portion 112b. The third rib portion 113b is provided on a surface of the third main body portion 113a on the main surface 12b side. The third rib portion 113b is formed so that the thickness of the connection portion 113 in the Z-axis direction is larger than the thickness of the central portion 114 in the Z-axis direction. The thickness of the third rib portion 113b in the Z-axis direction is the same as the thickness of each of the first rib portion 115b and the second rib portion 112*b* in the Z-axis direction. A width of the third rib portion 113*b* is larger than a width of each of the first rib portion 115*b* and the second rib portion 112*b*. The width of the third rib portion 113*b* is a length of the third rib portion 113*b* along an extending direction of the first rib portion 115*b*.

The movable mirror 11 further includes a pair of brackets 116 and a pair of brackets 117. The brackets 116 and the brackets 117 are formed by a part of the device layer 52. The brackets 116 extend along the Y-axis direction and have a rectangular shape when viewed from the Z-axis direction. One of the brackets 116 protrudes from a lateral surface of the frame portion 112 toward one side in the Y-axis direction, and the other bracket 116 protrudes from the lateral surface of the frame portion 112 toward the other side in the Y-axis direction. The pair of brackets 116 are disposed on the same central line parallel to the Y-axis direction. The brackets 116 are disposed on the first optical function unit 17 side with respect to the center of the main body portion 111.

The brackets 117 extend along the Y-axis direction, and have a rectangular shape when viewed from the Z-axis direction. One of the brackets 117 protrudes from the lateral surface of the frame portion 112 toward the one side in the Y-axis direction, and the other bracket 117 protrudes from the lateral surface of the frame portion 112 toward the other side in the Y-axis direction. The pair of brackets 117 are disposed on the same central line parallel to the Y-axis direction. The brackets 117 are disposed on the second optical function unit 18 side with respect to the center of the main body portion 111.

The drive unit 13 includes a first elastic support unit 14, a second elastic support unit 15, and an actuator unit 16. In the first elastic support unit 14, the second elastic support unit 15, and the actuator unit 16, a part other than a fourth rib portion 141*e*, a fifth rib portion 147*b*, a sixth rib portion 151*e*, and a seventh rib portion 157*b* to be described later is formed by a part of the device layer 52.

Each of the first elastic support unit 14 and the second elastic support unit 15 is connected between the base 12 and the movable mirror 11. The first elastic support unit 14 and the second elastic support unit 15 support the movable mirror 11 so that the movable mirror 11 is movable along the Z-axis direction.

The first elastic support unit 14 includes a pair of levers 141, a link 142, a link 143, a pair of first torsion bars (torsion support portions) 145, a pair of second torsion bars (torsion support portions) 146, and a pair of electrode support portions 147. The pair of levers 141 are respectively disposed on both sides of the first optical function unit 17 in the Y-axis direction. The levers 141 have a plate shape that extends along a plane perpendicular to the Z-axis direction. In this embodiment, the levers 141 extend along the X-axis direction.

The link 142 bridges ends 141*a* of the pair of levers 141 on the movable mirror 11 side. The link 142 has a plate shape that extends along a plane perpendicular to the Z-axis direction. Both ends of the link 142 extend along the Y-axis direction. An intermediate portion of the link 142 extends along the frame portion 112 and is curved in a convex shape toward a side opposite to the movable mirror 11. The link 143 bridges ends 141*b* of the pair of levers 141 on a side opposite to the movable mirror 11. The link 143 has a plate shape that extends along a plane perpendicular to the Z-axis direction, and extends along the Y-axis direction. In this embodiment, the first optical function unit 17 is an opening that is defined by the pair of levers 141, the link 142, and the link 143. The first optical function unit 17 has a rectangular shape when viewed from the Z-axis direction. For example, the first optical function unit 17 is a cavity. Alternatively, a material having optical transparency with respect to the measurement light L0 may be disposed in the opening that constitutes the first optical function unit 17.

The pair of first torsion bars 145 respectively bridge a tip end of one of the brackets 116 and one of the ends 141*a*, and a tip end of the other bracket 116 and the other end 141*a*. That is, the pair of first torsion bars 145 are respectively connected between the pair of levers 141 and the movable mirror 11. The first torsion bars 145 extend along the Y-axis direction. The pair of first torsion bars 145 are disposed on the same central line parallel to the Y-axis direction.

The pair of second torsion bars 146 respectively bridge an end 141*b* of one of the levers 141 on a side opposite to the movable mirror 11 and the base 12, and an end 141*b* of the other lever 141 on a side opposite to the movable mirror 11 and the base 12. That is, the pair of second torsion bars 146 are respectively connected between the pair of levers 141 and the base 12. The second torsion bars 146 extend along the Y-axis direction. The pair of second torsion bars 146 are disposed on the same central line parallel to the Y-axis direction. The end 141*b* of each of the levers 141 is provided with a protrusion 141*c* that protrudes toward an outer side in the Y-axis direction, and each of the second torsion bars 146 is connected to the protrusion 141*c*.

The electrode support portions 147 extend along the Y-axis direction, and have a rectangular shape when viewed from the Z-axis direction. One of the electrode support portions 147 extends from an intermediate portion of one of the levers 141 toward a side opposite to the first optical function unit 17. The other electrode support portion 147 protrudes from an intermediate portion of the other lever 141 toward a side opposite to the first optical function unit 17. The pair of electrode support portions 147 are disposed on the same central line parallel to the Y-axis direction when viewed from the Z-axis direction.

The second elastic support unit 15 includes a pair of levers 151, a link 152, a link 153, a pair of first torsion bars (torsion support portions) 155, a pair of second torsion bars (torsion support portions) 156, and a pair of electrode support portions 157. The pair of levers 151 are respectively disposed on both sides of the second optical function unit 18 in the Y-axis direction. The levers 151 have a plate shape that extends along a plane perpendicular to the Z-axis direction. In this embodiment, the levers 151 extend along the X-axis direction.

The link 152 bridges ends 151*a* of the pair of levers 151 on the movable mirror 11 side. The link 152 has a plate shape that extends along a plane perpendicular to the Z-axis direction. Both ends of the link 152 extend along the Y-axis direction. An intermediate portion of the link 152 extends along the frame portion 112 and is curved in a convex shape toward a side opposite to the movable mirror 11. The link 153 bridges ends 151*b* of the pair of levers 151 on a side opposite to the movable mirror 11. The link 153 has a plate shape that extends along a plane perpendicular to the Z-axis direction, and extends along the Y-axis direction. In this embodiment, the second optical function unit 18 is an opening that is defined by the pair of levers 151, the link 152, and the link 153. The second optical function unit 18 has a rectangular shape when viewed from the Z-axis direction. For example, the second optical function unit 18 is a cavity. Alternatively, a material having optical transparency with respect to the measurement light L0 may be disposed in the opening that constitutes the second optical function unit 18.

The pair of first torsion bars 155 respectively bridge a tip end of one of the brackets 117 and one of the ends 151*a*, and a tip end of the other bracket 117 and the other end 151*a*. That is, the pair of first torsion bars 155 are respectively connected between the pair of levers 151 and the movable mirror 11. The first torsion bars 155 extend along the Y-axis direction. The pair of first torsion bars 155 are disposed on the same central line parallel to the Y-axis direction.

The pair of second torsion bars 156 respectively bridge an end 151*b* of one of the levers 151 on a side opposite to the movable mirror 11 and the base 12, and an end 151*b* of the other lever 151 on a side opposite to the movable mirror 11 and the base 12. That is, the pair of second torsion bars 156 are respectively connected between the pair of levers 151 and the base 12. The second torsion bars 156 extend along the Y-axis direction. The pair of second torsion bars 156 are disposed on the same central line parallel to the Y-axis direction. The end 151*b* of each of the levers 151 is provided with a protrusion 151*c* that protrudes toward an outer side in the Y-axis direction, and each of the second torsion bars 156 is connected to the protrusion 151*c*.

The electrode support portions 157 extend along the Y-axis direction, and have a rectangular shape when viewed from the Z-axis direction. One of the electrode support portions 157 extends from an intermediate portion of one of the levers 151 toward a side opposite to the second optical function unit 18. The other electrode support portion 157 protrudes from an intermediate portion of the other lever 151 toward a side opposite to the second optical function unit 18. The pair of electrode support portions 157 are disposed on the same central line parallel to the Y-axis direction when viewed from the Z-axis direction.

The actuator unit 16 moves the movable mirror 11 along the Z-axis direction. The actuator unit 16 includes a pair of first fixed comb electrodes 161, a pair of first movable comb electrodes 162, a pair of first fixed comb electrodes 163, a pair of first movable comb electrodes 164, a pair of second fixed comb electrodes 165, and a pair of second movable comb electrodes 166. Positions of the first fixed comb electrodes 161 and 163, and the second fixed comb electrodes 165 are fixed. The first movable comb electrodes 162 and 164, and the second movable comb electrodes 166 move in accordance with movement of the movable mirror 11.

One of the first fixed comb electrodes 161 is provided on a surface of the device layer 52 of the base 12 which faces one of the electrode support portions 147. The other first fixed comb electrode 161 is provided on a surface of the device layer 52 which faces the other electrode support portion 147. Each of the first fixed comb electrodes 161 includes a plurality of first fixed comb fingers 161*a* which extend along a plane perpendicular to the Y-axis direction. The first fixed comb fingers 161*a* are disposed to be aligned with a predetermined interval in the Y-axis direction.

One of the first movable comb electrodes 162 is provided on a surface of one of the electrode support portions 147 on the other side (the electrode support portion 157 side) in the X-axis direction. The other first movable comb electrode 162 is provided on a surface of the other electrode support portion 147 on the other side in the X-axis direction. That is, the pair of first movable comb electrodes 162 are respectively supported by the pair of electrode support portions 147. Each of the first movable comb electrodes 162 includes a plurality of first movable comb fingers 162*a* which extend along a plane perpendicular to the Y-axis direction. The first movable comb fingers 162*a* are disposed to be aligned with a predetermined interval in the Y-axis direction.

In one of the first fixed comb electrodes 161 and one of the first movable comb electrodes 162, the plurality of first fixed comb fingers 161*a* and the plurality of first movable comb fingers 162*a* are alternately disposed. That is, each of the first fixed comb fingers 161*a* of one of the first fixed comb electrodes 161 is located between the first movable comb fingers 162*a* of one of the first movable comb electrodes 162. In the other first fixed comb electrode 161 and the other first movable comb electrode 162, the plurality of first fixed comb fingers 161*a* and the plurality of first movable comb fingers 162*a* are alternately disposed. That is, each of the first fixed comb fingers 161*a* of the other first fixed comb electrode 161 is located between the first movable comb fingers 162*a* of the other first movable comb electrode 162. In the pair of first fixed comb electrodes 161 and the pair of first movable comb electrodes 162, the first fixed comb fingers 161*a* and the first movable comb fingers 162*a* which are adjacent to each other face each other in the Y-axis direction. For example, a distance between the first fixed comb fingers 161*a* and the first movable comb fingers 162*a* which are adjacent to each other is approximately several μm.

One of the first fixed comb electrodes 163 is provided on a surface of the device layer 52 of the base 12 which faces one of the electrode support portions 157. The other first fixed comb electrode 163 is provided on a surface of the device layer 52 which faces the other electrode support portion 157. Each of the first fixed comb electrodes 163 includes a plurality of first fixed comb fingers 163*a* which extend along a plane perpendicular to the Y-axis direction. The first fixed comb fingers 163*a* are disposed to be aligned with a predetermined interval in the Y-axis direction.

One of the first movable comb electrodes 164 is provided on a surface of one of the electrode support portions 157 on the one side (the electrode support portion 147 side) in the X-axis direction. The other first movable comb electrode 164 is provided on a surface of the other electrode support portion 157 on the one side in the X-axis direction. That is, the pair of first movable comb electrodes 164 are respectively supported by the pair of electrode support portions 157. Each of the first movable comb electrodes 164 includes a plurality of first movable comb fingers 164*a* which extend along a plane perpendicular to the Y-axis direction. The first movable comb fingers 164*a* are disposed to be aligned with a predetermined interval in the Y-axis direction.

In one of the first fixed comb electrodes 163 and one of the first movable comb electrodes 164, the plurality of first fixed comb fingers 163*a* and the plurality of first movable comb fingers 164*a* are alternately disposed. That is, each of the first fixed comb fingers 163*a* of one of the first fixed comb electrodes 163 is located between the first movable comb fingers 164*a* of one of the first movable comb electrodes 164. In the other first fixed comb electrode 163 and the other first movable comb electrode 164, the plurality of first fixed comb fingers 163*a* and the plurality of first movable comb fingers 164*a* are alternately disposed. That is, each of the first fixed comb fingers 163*a* of the other first fixed comb electrode 163 is located between the first movable comb fingers 164*a* of the other first movable comb electrode 164. In the pair of first fixed comb electrodes 163 and the pair of first movable comb electrodes 164, the first fixed comb fingers 163*a* and the first movable comb fingers 164*a* which are adjacent to each other face each other in the Y-axis direction. For example, a distance between the first fixed comb fingers 163*a* and the first movable comb fingers 164*a* which are adjacent to each other is approximately several μm.

The pair of second fixed comb electrodes 165 are disposed along an outer edge of the movable mirror 11. The pair of second fixed comb electrodes 165 are provided on a surface, which faces an outer surface of the frame portion 112 in the Y-axis direction, of the device layer 52 of the base 12. Each of the second fixed comb electrodes 165 includes a plurality of second fixed comb fingers 165a which extend along a plane perpendicular to the X-axis direction. The second fixed comb fingers 165a are disposed to be aligned with a predetermined interval in the X-axis direction.

The pair of second movable comb electrodes 166 are disposed along an outer edge of the movable mirror 11. The pair of second movable comb electrodes 166 are provided on the outer surface of the frame portion 112 in the Y-axis direction. That is, the frame portion 112 constitutes an electrode support portion that supports the second movable comb electrodes 166. Each of the second movable comb electrodes 166 includes a plurality of second movable comb fingers 166a which extend along a plane perpendicular to the X-axis direction. The second movable comb fingers 166a are disposed to be aligned with a predetermined interval in the X-axis direction.

In one of the second fixed comb electrodes 165 and one of the second movable comb electrodes 166, the plurality of second fixed comb fingers 165a and the plurality of second movable comb fingers 166a are alternately disposed. That is, each of the second fixed comb fingers 165a of one of the second fixed comb electrodes 165 is located between the second movable comb fingers 166a of one of the second movable comb electrodes 166. In the other second fixed comb electrode 165 and the other second movable comb electrode 166, the plurality of second fixed comb fingers 165a and the plurality of second movable comb fingers 166a are alternately disposed. That is, each of the second fixed comb fingers 165a of the other second fixed comb electrode 165 is located between the second movable comb fingers 166a of the other second movable comb electrode 166. In the pair of second fixed comb electrodes 165 and the pair of second movable comb electrodes 166, the second fixed comb fingers 165a and the second movable comb fingers 166a which are adjacent to each other face each other in the X-axis direction. For example, a distance between the second fixed comb fingers 165a and the second movable comb fingers 166a which are adjacent to each other is approximately several μm.

A plurality of electrode pads 121 and 122 are provided in the base 12. The electrode pads 121 and 122 are formed on a surface of the device layer 52 in openings 12c formed in the main surface 12b of the base 12 to reach the device layer 52. The electrode pads 121 are electrically connected to the first fixed comb electrodes 161, the first fixed comb electrodes 163, or the second fixed comb electrodes 165 through the device layer 52. Several pieces of the electrode pads 122 are electrically connected to the first movable comb electrodes 162 or the first movable comb electrodes 164 through the first elastic support unit 14 or the second elastic support unit 15. The other electrode pads 122 are electrically connected to the second movable comb electrodes 166 through the first elastic support unit 14 and the frame portion 112 of the movable mirror 11, or through the second elastic support unit 15 and the frame portion 112 of the movable mirror 11. Each of the wires 26 bridges each of the electrode pads 121 and 122 and each of the lead pins 25.

The first fixed comb electrodes 161 and 163, and the first movable comb electrodes 162 and 164 can be used as an electrode for driving. Specifically, when a voltage is applied to between the plurality of electrode pads 121 and the plurality of electrode pads 122 through the plurality of lead pins 25 and the plurality of wires 26, an electrostatic force occurs between the first fixed comb electrodes 161 and the first movable comb electrodes 162 which face each other, and between the first fixed comb electrodes 163 and the first movable comb electrodes 164 which face each other to move the movable mirror 11, for example, toward one side in the Z-axis direction. At this time, the first torsion bars 145 and 155 and the second torsion bars 146 and 156 in the first elastic support unit 14 and the second elastic support unit 15 are twisted, and an elastic force occurs in the first elastic support unit 14 and the second elastic support unit 15. In the optical device 10, when a periodic electric signal is applied to the first fixed comb electrodes 161 and 163, and the first movable comb electrodes 162 and 164 through the plurality of lead pins 25 and the plurality of wires 26, it is possible to reciprocate the movable mirror 11 along the Z-axis direction at a resonance frequency level. In this manner, the drive unit 13 functions as an electrostatic actuator.

The second fixed comb electrodes 165 and the second movable comb electrodes 166 can be used as an electrode for monitoring. Specifically, electrostatic capacitance between the second fixed comb electrodes 165 and the second movable comb electrodes 166 is detected through the plurality of lead pins 25 and the plurality of wires 26, and the plurality of electrode pads 121 and the plurality of electrode pads 122. The electrostatic capacitance varies in correspondence with a position of the movable mirror 11 in the Z-axis direction. Accordingly, it is possible to perform feedback control of the position of the movable mirror 11 by adjusting drive vibration (the magnitude, a period, and the like of an application voltage) in correspondence with electrostatic capacitance that is detected.

[Detailed Configuration of Respective Parts]

Configurations of the frame portion 112, the levers 141 and 151, and the electrode support portions 147 and 157 will be further described with reference to FIG. 2 to FIG. 6.

As described above, the frame portion 112 constitutes an electrode support portion that supports the second movable comb electrodes 166. In addition, as described above, the frame portion 112 includes the second rib portion 112b that is formed so that the thickness of the frame portion 112 in the Z-axis direction is larger than the thickness of the central portion 114 in the Z-axis direction. Here, the thickness of the frame portion 112 in the Z-axis direction is larger than the thickness of the second movable comb fingers 166a in the Z-axis direction (refer to FIG. 5). That is, the second rib portion 112b is formed so that the thickness of the frame portion 112 in the Z-axis direction is larger than the thickness of the second movable comb fingers 166a in the Z-axis direction.

Each of the levers 141 includes a fourth main body portion 141d and a fourth rib portion 141e. The fourth main body portion 141d is formed by a part of the device layer 52. The fourth rib portion 141e is formed by a part of the support layer 51 and the intermediate layer 53. The fourth rib portion 141e is provided on a surface of the fourth main body portion 141d on the main surface 12b side. The fourth rib portion 141e has an elongated rectangular shape when viewed from the Z-axis direction.

In each of the levers 141, the fourth rib portion 141e is formed as follows. The fourth rib portion 141e is formed so that the thickness of the lever 141 in the Z-axis direction is larger than the thickness of the first movable comb fingers 162a in the Z-axis direction. The fourth rib portion 141e extends along the X-axis direction between the both ends 141a and 141b of the lever 141. That is, in the lever 141, the fourth rib portion 141e extends between a connection position with the first torsion bar 145 and a connection position with the link 143. An outer edge of the fourth rib portion 141e in the Y-axis direction (an edge on a side opposite to the first optical function unit 17) extends along an outer edge of the lever 141 in the Y-axis direction with a predetermined interval from the outer edge of the lever 141 when viewed from the Z-axis direction. An inner edge of the fourth rib portion 141e in the Y-axis direction (an edge on the first optical function unit 17 side) extends along an inner edge of the lever 141 in the Y-axis direction with a predetermined interval from the inner edge when viewed from the Z-axis direction.

Each of the electrode support portions 147 includes a fifth main body portion 147a and a fifth rib portion 147b. The fifth main body portion 147a is formed by a part of the device layer 52. The fifth main body portion 147a is connected to the fourth main body portion 141d. The first movable comb electrodes 162 extend from the fifth main body portion 147a. The fifth rib portion 147b is formed by a part of the support layer 51 and the inter mediate layer 53. The fifth rib portion 147b is formed on a surface of the fifth main body portion 147a on the main surface 12b side. The fifth rib portion 147b is connected to the fourth rib portion 141e. The fifth rib portion 147b has a rectangular shape when viewed from the Z-axis direction.

In the electrode support portion 147, the fifth rib portion 147b is faulted as follows. The fifth rib portion 147b is formed so that the thickness of the electrode support portion 147 in the Z-axis direction is larger than the thickness of the first movable comb fingers 162a in the Z-axis direction. The fifth rib portion 147b extends between both ends of the electrode support portion 147 along the Y-axis direction. An edge of the fifth rib portion 147b on one side in the X-axis direction extends along an edge of the electrode support portion 147 on the one side in the X-axis direction with a predetermined interval from the edge on the one side when viewed from the Z-axis direction. An edge of the fifth rib portion 147b on the other side in the X-axis direction extends along an edge of the electrode support portion 147 on the other side in the X-axis direction with a predetermined interval from the edge on the other side when viewed from the Z-axis direction.

The thickness of the fourth rib portion 141e in the Z-axis direction is the same as the thickness of the first rib portion 115b in the Z-axis direction. A width of the fourth rib portion 141e (a length in the Y-axis direction) is wider than a width of the first rib portion 115b and is approximately the same as a width of the second rib portion 112b. The thickness of the fifth rib portion 147b is approximately the same as the thickness of the fourth rib portion 141e. A width of the fifth rib portion 147b (a length in the X-axis direction) is approximately the same as the width of the fourth rib portion 141e, or is slightly smaller than the width of the fourth rib portion 141e. The thickness of each of the first rib portion 115b, the fourth rib portion 141e, and the fifth rib portion 147b in the Z-axis direction is larger than the thickness of the first torsion bar 145 and the second torsion bar 146 in the Z-axis direction.

The thickness T1 of the electrode support portion 147 in the Z-axis direction and the thickness T2 of the first movable comb finger 162a in the Z-axis direction may satisfy the following Expression (2) to suppress distortion of the electrode support portion 147 that supports the first movable comb electrodes 162 during movement of the movable mirror 11 along the Z-axis direction.

$$T1^3 \times W1/C1^3 \geq N1 \times T2^3 \times W2/C2^3 \qquad (2)$$

In Expression (1) described above, W1 is a width of the electrode support portions 147 (a length in the X-axis direction), C1 is a length of the electrode support portions 147 (a length in the Y-axis direction), N1 is the number of the first movable comb fingers 162a included in one piece of the first movable comb electrode 162, W2 is a width of the first movable comb finger 162a (a length in the Y-axis direction), and C2 is a length of the first movable comb finger 162a when viewed from the Z-axis direction (a length in the X-axis direction). According to this, it is possible to make the electrode support portions 147 be less likely to be distorted in comparison to the first movable comb electrode 162.

Figure 2:
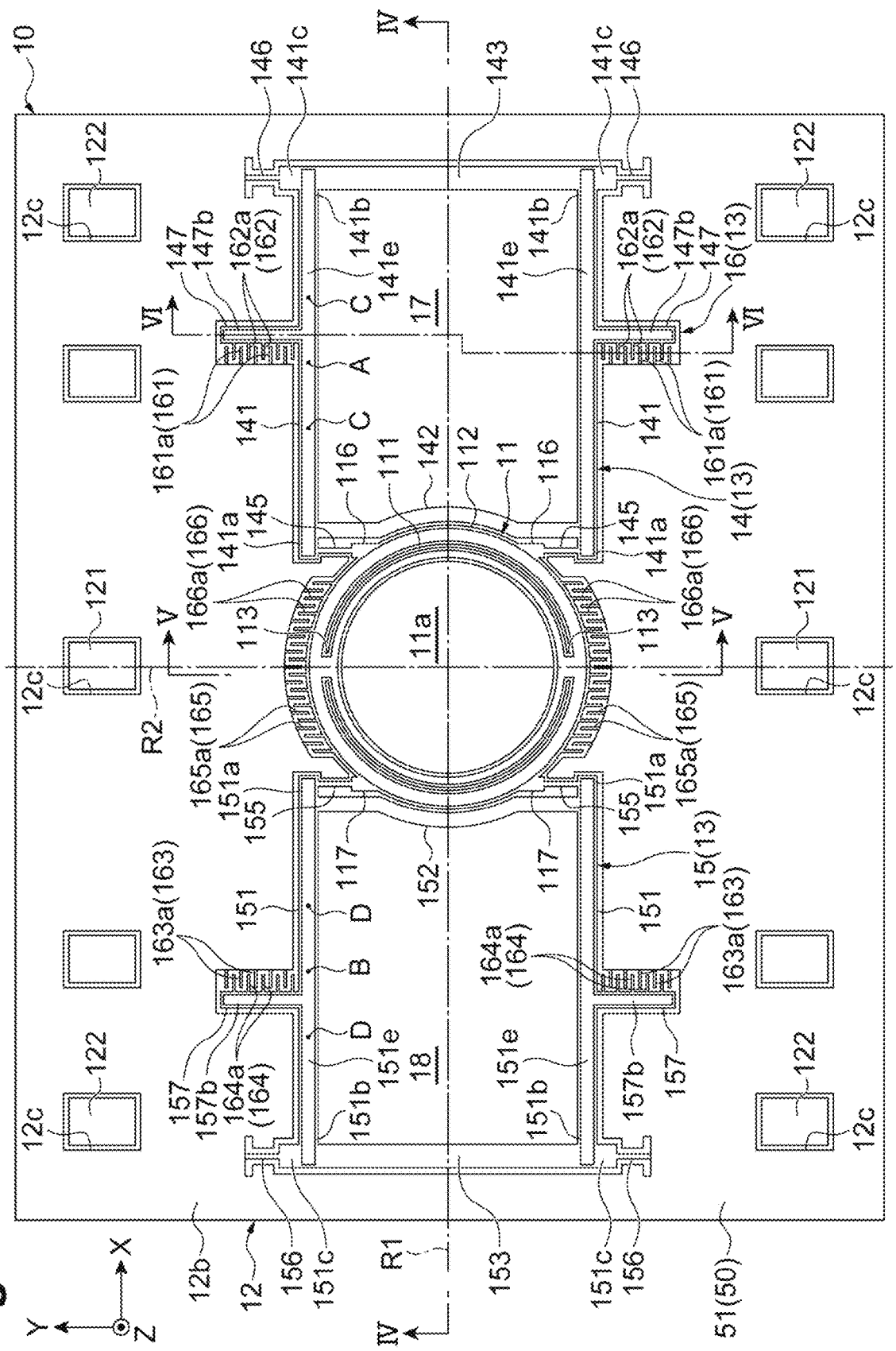
FIG. 2 is a plan view of the optical device illustrated in FIG. 1.
Figure 3:
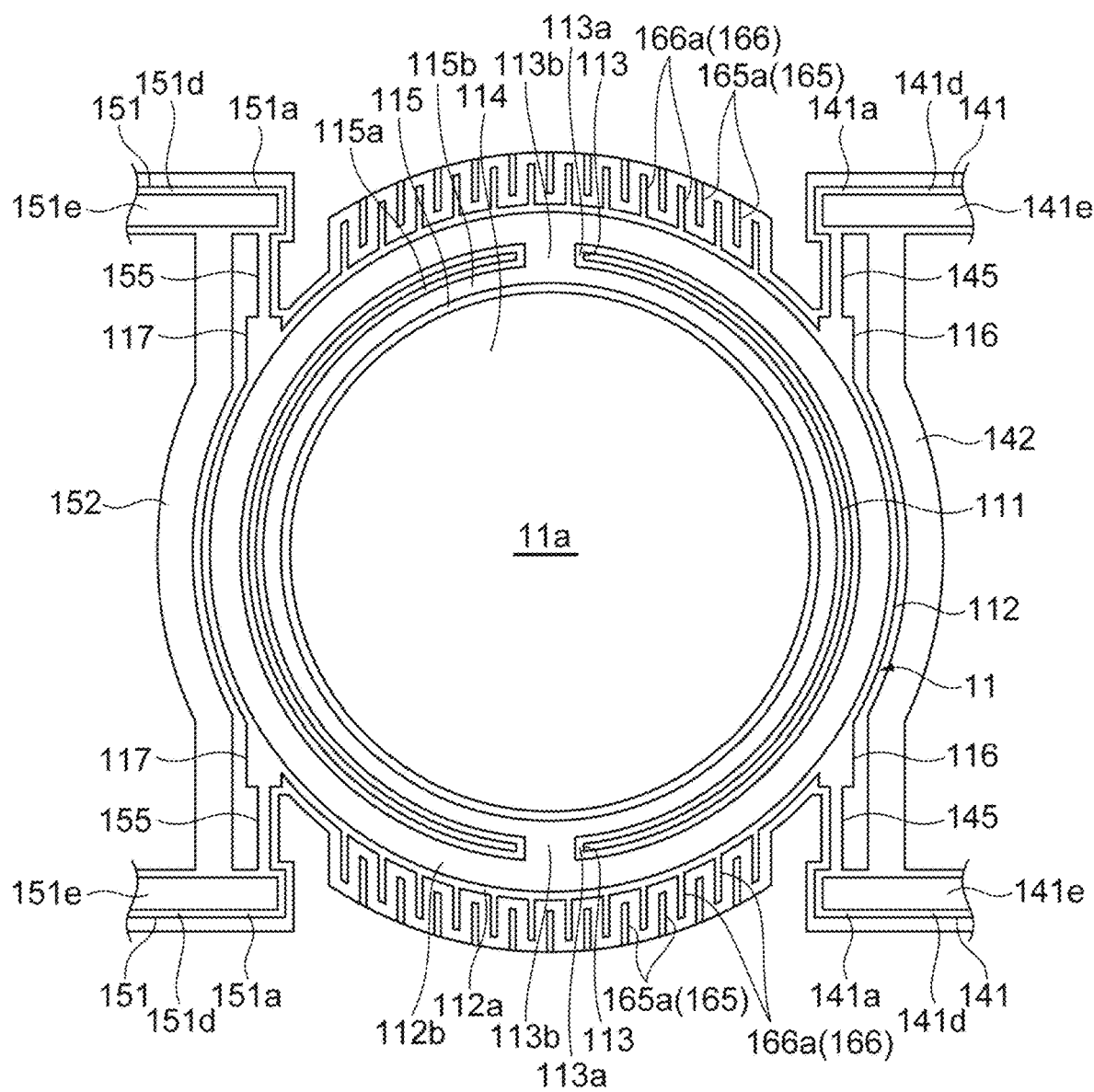
FIG. 3 is a plan view illustrating a part of FIG. 2 in an enlarged manner.
Figure 4:
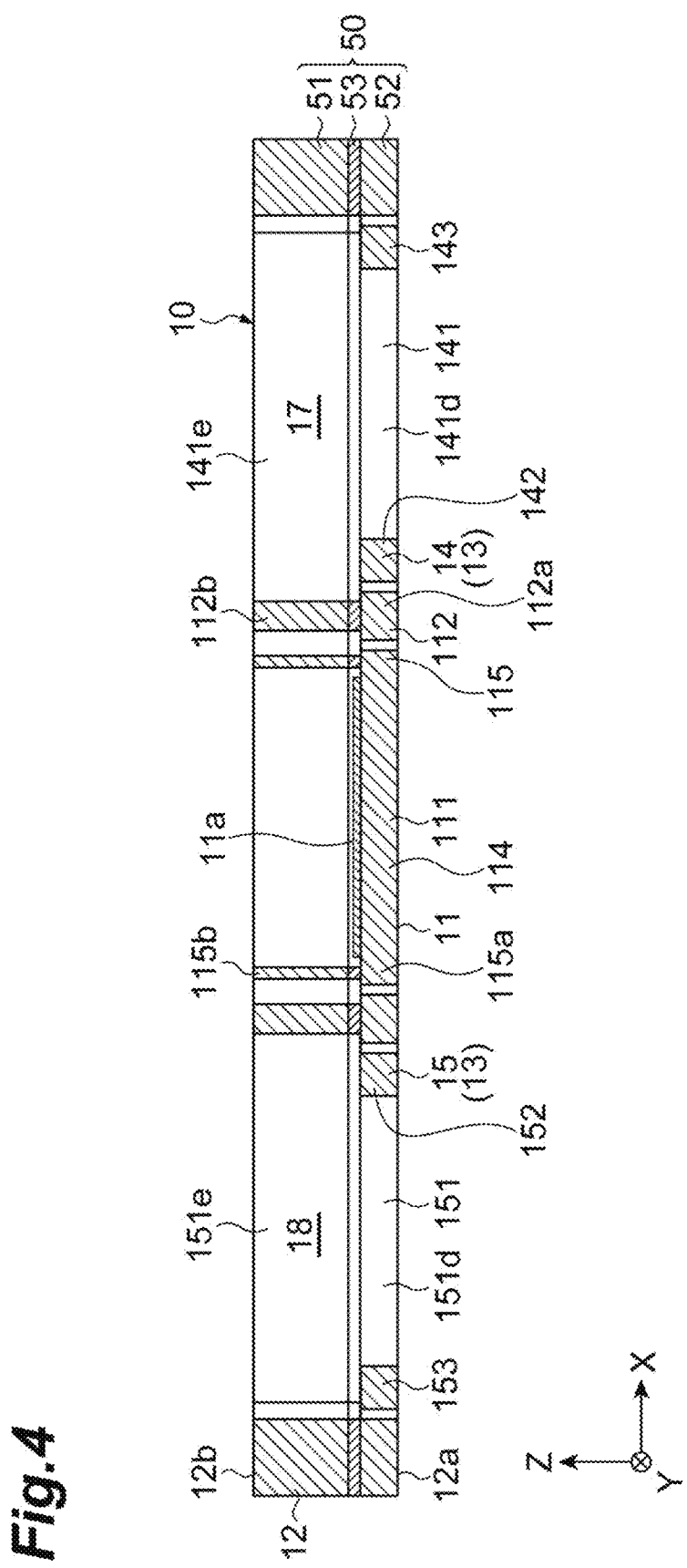
FIG. 4 is a cross-sectional view taken along line IV-IV in FIG. 2.
Figure 5:
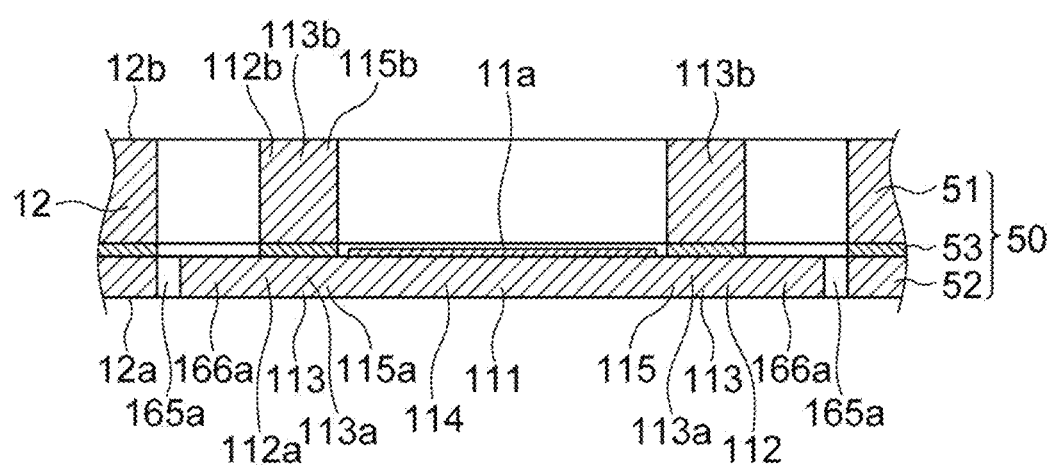
FIG. 5 is a cross-sectional view taken along line V-V in FIG. 2.
Figure 6:
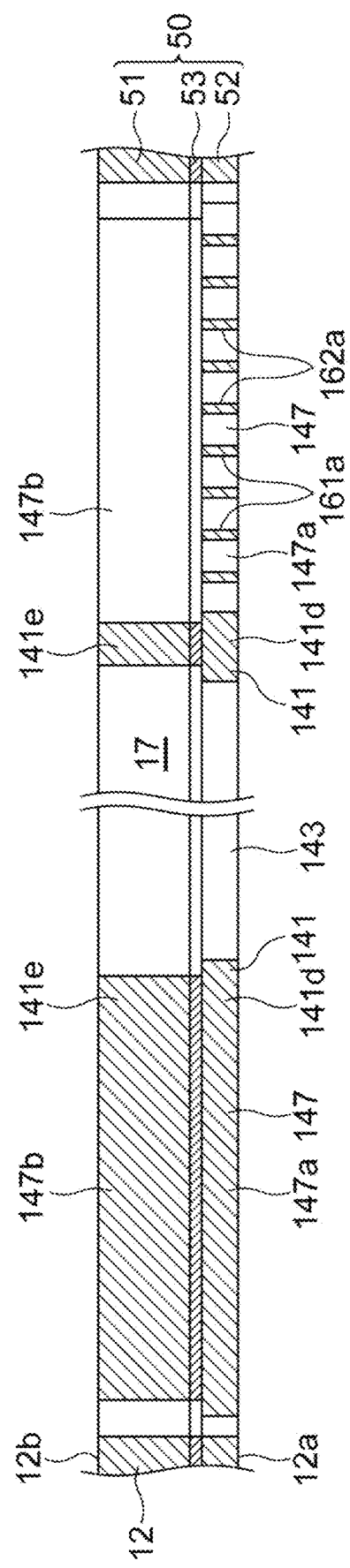
FIG. 6 is a cross-sectional view taken along line VI-VI in FIG. 2.

In this embodiment, the electrode support portions 147 and the first movable comb electrodes 162 are disposed to be located on a side opposite to the movable mirror 11 with respect to the center A of the levers 141 in the X-axis direction (an extending direction of the levers 141) to secure a distance between the first fixed comb electrodes 161 and the first movable comb electrodes 162, and the movable mirror 11 (refer to FIG. 2).

Each of the levers 151 includes a sixth main body portion 151d and a sixth rib portion 151e. The sixth main body portion 151d is formed by a part of the device layer 52. The sixth rib portion 151e is formed by a part of the support layer 51 and an intermediate layer 53. The sixth rib portion 151e is provided on a surface of the sixth main body portion 151d on the main surface 12b side. The sixth rib portion 151e has an elongated rectangular shape when viewed from the Z-axis direction.

In the lever 151, the sixth rib portion 151e is formed as follows. The sixth rib portion 151e is formed so that the thickness of the lever 151 in the Z-axis direction is larger than the thickness of the first movable comb fingers 164a in the Z-axis direction. The sixth rib portion 151e extends along the X-axis direction between the both ends 151a and 151b of the lever 151. That is, in the lever 151, the sixth rib portion 151e extends between a connection position with the first torsion bar 155 and a connection position with the link 153. An outer edge of the sixth rib portion 151e in the Y-axis direction (an edge on a side opposite to the second optical function unit 18) extends along an outer edge of the lever 151 in the Y-axis direction with a predetermined interval from the outer edge of the lever 151 when viewed from the Z-axis direction. An inner edge of the sixth rib portion 151e in the Y-axis direction (an edge on the second optical function unit 18 side) extends along an inner edge of the lever 151 in the Y-axis direction with a predetermined interval from the inner edge when viewed from the Z-axis direction. For example, the sixth rib portion 151e is formed in the same shape as in the fourth rib portion 141e.

Each of the electrode support portions 157 includes a seventh main body portion 157a and a seventh rib portion 157b. The seventh main body portion 157a is formed by a part of the device layer 52. The seventh main body portion 157a is connected to the sixth main body portion 151d. The first movable comb electrodes 164 extend from the seventh main body portion 157a. The seventh rib portion 157b is formed by a part of the support layer 51 and the intermediate layer 53. The seventh rib portion 157b is formed on a surface of the seventh main body portion 157a on the main surface 12b side. The seventh rib portion 157b is connected to the sixth rib portion 151e. The seventh rib portion 157b has a rectangular shape when viewed from the Z-axis direction.

In the electrode support portion 157, the seventh rib portion 157b is formed as follows. The seventh rib portion 157b is formed so that the thickness of the electrode support portion 157 in the Z-axis direction is larger than the thickness of the first movable comb fingers 164a in the Z-axis direction. The seventh rib portion 157b extends between both ends of the electrode support portion 157 along the Y-axis direction. An edge of the seventh rib portion 157b on one side in the X-axis direction extends along an edge of the electrode support portion 157 on the one side in the X-axis direction with a predetermined interval from the edge on the one side when viewed from the Z-axis direction. An edge of the seventh rib portion 157b on the other side in the X-axis direction extends along an edge of the electrode support portion 157 on the other side in the X-axis direction with a predetermined interval from the edge on the other side when viewed from the Z-axis direction. For example, the seventh rib portion 157b is formed in the same shape as in the fifth rib portion 147b.

The thickness T3 of the electrode support portion 157 in the Z-axis direction and the thickness T4 of the first movable comb finger 164a in the Z-axis direction may satisfy the following Expression (3) to suppress distortion of the electrode support portion 157 that supports the first movable comb electrodes 164 during movement of the movable mirror 11 along the Z-axis direction.

$$T3^3 \times W3/C3^3 \geq N2 \times T4^3 \times W4/C4^3 \qquad (3)$$

In Expression (3) described above, W3 is a width of the electrode support portions 157 (a length in the X-axis direction), C1 is a length of the electrode support portions 157 (a length in the Y-axis direction), N2 is the number of the first movable comb fingers 164a included in one piece of the first movable comb electrode 164, W4 is a width of the first movable comb finger 164a (a length in the Y-axis direction), and C4 is a length of the first movable comb finger 164a (a length in the X-axis direction). According to this, it is possible to make the electrode support portions 157 be less likely to be distorted in comparison to the first movable comb electrode 164.

In this embodiment, the electrode support portions 157 and the first movable comb electrodes 164 are disposed to be located on a side opposite to the movable mirror 11 with respect to the center B of the levers 151 in the X-axis direction (an extending direction of the levers 151) to secure a distance from the first fixed comb electrodes 163 and the first movable comb electrodes 164 to the movable mirror 11 (refer to FIG. 2).

Function and Effect

In the above-described optical device 10, since the fifth rib portion 147b is formed, the thickness of the electrode support portion 147 in the Z-axis direction is larger than the thickness of the first movable comb fingers 162a in the Z-axis direction, and the first movable comb electrode 162 is supported by the electrode support portion 147. In addition, since the seventh rib portion 157b is formed, the thickness of the electrode support portion 157 in the Z-axis direction is larger than the thickness of the first movable comb fingers 164a in the Z-axis direction, and the first movable comb electrode 164 is supported by the electrode support portion 157. In addition, since the second rib portion 112b is formed, the thickness of the frame portion 112 in the Z-axis direction is larger than the thickness of the second movable comb fingers 166a in the Z-axis direction, and the second movable comb electrode 166 is supported by the frame portion 112. Accordingly, it is possible to suppress distortion of the electrode support portions 147 and 157, and the frame portion 112 which respectively support the first movable comb electrodes 162 and 164, and the second movable comb electrode 166 during movement of the movable mirror 11 along the Z-axis direction. Accordingly, it is possible to cause the first movable comb electrodes 162 and 164, and the second movable comb electrode 166 to move integrally with the movable mirror 11, and it is possible to suppress fluctuation of an interval between the first movable comb fingers 162a and the first fixed comb fingers 161a which are adjacent to each other, an interval between the first movable comb fingers 164a and the first fixed comb fingers 163a which are adjacent to each other, and an interval between the second movable comb fingers 166a and the second fixed comb fingers 165a which are adjacent to each other. As a result, it is possible to enhance reliability.

In addition, in the optical device 10, it is possible to suppress fluctuation of an interval between the first movable comb electrodes 162 and 164, and the first fixed comb electrodes 161 and 163 due to the electrode support portion 147 that extends from the lever 141, and the electrode support portion 157 that extends from the lever 151.

In addition, in the optical device 10, the first movable comb electrode 162 is located on a side opposite to the movable mirror 11 with respect to the center A of the lever 141 in the X-axis direction. Accordingly, even when the movable mirror 11 greatly moves along the Z-axis direction, the first movable comb fingers 162a are less likely to deviate from a region between the first fixed comb fingers 161a which are adjacent to each other. In addition, the first movable comb electrode 164 is located on a side opposite to the movable mirror 11 with respect to the center B of the lever 151 in the X-axis direction. Accordingly, even when the movable mirror 11 greatly moves along the Z-axis direction, the first movable comb fingers 164a are less likely to deviate from a region between the first fixed comb fingers 163a which are adjacent to each other. Accordingly, it is possible to allow an electrostatic force to occur between the first fixed comb electrodes 161 and the first movable comb electrodes 162, and between the first fixed comb electrodes 163 and the first movable comb electrodes 164 over the entirety of a movable range of the movable mirror 11.

In addition, in the optical device 10, as illustrated in FIG. 2, the electrode support portions 147 and the first movable comb electrodes 162 are located between points C and C which divide the lever 141 into three parts in the X-axis direction. In addition, the electrode support portions 157 and the first movable comb electrodes 164 are located between points D and D which divide the lever 151 into three parts in the X-axis direction. Accordingly, it is possible to realize compatibility of occurrence of the electrostatic force between the first fixed comb electrodes 161 and the first movable comb electrodes 162 and between the first fixed comb electrodes 163 and the first movable comb electrodes 164 over the entirety of the movable range of the movable mirror 11, and efficient usage of the electrostatic force as a driving force of the movable mirror 11.

In addition, in the optical device 10, the lever 141 includes the fourth rib portion 141e that is formed so that the thickness of the lever 141 in the Z-axis direction is larger than the thickness of the first movable comb fingers 162a in the Z-axis direction. In addition, the lever 151 includes the sixth rib portion 151e that is formed so that the thickness of the lever 151 in the Z-axis direction is larger than the thickness of the first movable comb fingers 164a in the Z-axis direction. Accordingly, it is possible to more reliably suppress fluctuation of the interval between the first movable comb electrodes 162 and 164 and, the first fixed comb electrodes 161 and 163, and thus it is possible to further enhance the reliability.

In addition, in the optical device 10, the thickness T1 of the electrode support portion 147 in the Z-axis direction, and the thickness T2 of the first movable comb finger 162a in the Z-axis direction satisfy Expression (2) described above. In addition, the thickness T3 of the electrode support portion 157 in the Z-axis direction and the thickness T4 of the first movable comb finger 164a in the Z-axis direction satisfy Expression (3) described above. Accordingly, it is possible to more reliably suppress fluctuation of the interval between the first movable comb electrodes 162 and 164, and the first fixed comb electrodes 161 and 163.

In addition, in the optical device 10, the electrode support portion (frame portion 112) is provided in the movable mirror 11 to be disposed along the outer edge of the movable mirror 11. Accordingly, it is possible to secure a distance from a connection position with respect to the base 12 in the first elastic support unit 14 and the second elastic support unit 15 to the second movable comb electrode 166. As a result, a variation of electrostatic capacitance between the second fixed comb electrode 165 and the second movable comb electrode 166 is great, and thus it is possible to easily and reliably detect a position of the movable mirror 11.

In addition, in the optical device 10, an electrode support portion is constituted by the frame portion 112. Accordingly, it is possible to suppress fluctuation of an interval between the second movable comb electrode 166 and the second fixed comb electrode 165 due to the frame portion 112 that surrounds the main body portion 111. In addition, in the optical device 10, the movable mirror 11 includes the main body portion 111, the frame portion 112 that surrounds the main body portion with a predetermined interval from the main body portion 111 when viewed from the Z-axis direction, and the connection portion 113 that connects the main body portion 111 and the frame portion 112. Accordingly, a sectional force (bending moment) from the first torsion bars 145 and 155 is less likely to be transmitted to the main body portion 111, and thus it is possible to suppress distortion of the main body portion 111 during movement of the movable mirror 11 along the Z-axis direction.

In addition, in the optical device 10, since the first rib portion 115b is formed, the thickness of the outer edge portion 115 in the Z-axis direction is larger than the thickness of the central portion 114 in the Z-axis direction. Accordingly, it is possible to suppress distortion of the main body portion 111 during movement of the movable mirror 11 along the Z-axis direction. In addition, since the second rib portion 112b is formed, the thickness of the frame portion 112 in the Z-axis direction is larger than the thickness of the central portion 114 in the Z-axis direction. Accordingly, it is possible to suppress distortion of the frame portion 112 during movement of the movable mirror 11 along the Z-axis direction, and it is possible to suppress distortion of the main body portion 111 which is caused by the distortion of the frame portion 112.

Modification Example

Figure 7:
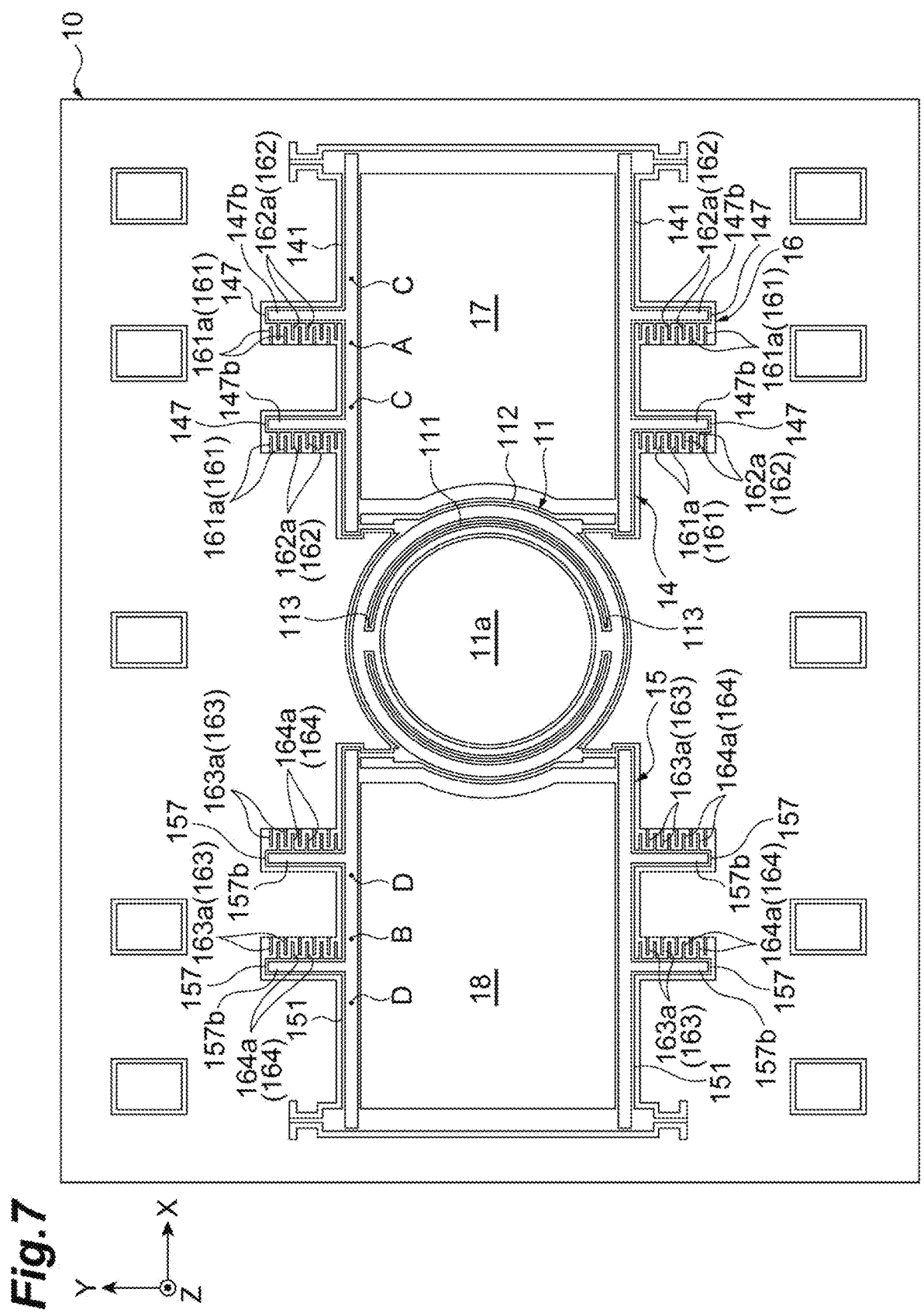
FIG. 7 is a plan view illustrating an optical device according to a first modification example.

Hereinbefore, the embodiment has been described, but the present disclosure is not limited to the embodiment. The optical device 10 may be constituted as in a first modification example illustrated in FIG. 7. In the first modification example, a pair of the electrode support portions 147 are provided in each of the levers 141. The first movable comb electrode 162 is provided in each of the electrode support portions 147. In each of the levers 141, the pair of electrode support portions 147 are formed as follows. The pair of electrode support portions 147 are disposed to be aligned along the X-axis direction. One of the electrode support portions 147 is disposed at the same position as in the electrode support portion 147 in the embodiment. The other electrode support portion 147, and the first movable comb electrode 162 supported by the other electrode support portion 147 are located on the movable mirror 11 side with respect to the center A of the lever 141 in the X-axis direction. More specifically, the other electrode support portion 147 and the first movable comb electrode 162 supported by the other electrode support portion 147 are located on the movable mirror 11 side in comparison to the points C and C which divide the lever 141 into three parts in the X-axis direction.

In the first modification example, a pair of the electrode support portions 157 are provided in each of the levers 151. The first movable comb electrode 164 is provided in each of the electrode support portions 157. In each of the levers 151, the pair of electrode support portions 157 are formed as follows. The pair of electrode support portions 157 are disposed to be aligned along the X-axis direction. One of the electrode support portions 157 is disposed at the same position as in the electrode support portion 157 in the embodiment. The other electrode support portion 157, and the first movable comb electrode 164 supported by the other electrode support portion 157 are located on the movable mirror 11 side with respect to the center A of the lever 151 in the X-axis direction. More specifically, the other electrode support portion 157 and the first movable comb electrode 164 supported by the other electrode support portion 157 are located on the movable mirror 11 side in comparison to the points D and D which divide the lever 151 into three parts in the X-axis direction.

According to the first modification example, as in the embodiment, it is possible to suppress distortion of the electrode support portions 147 and 157 which support the first movable comb electrodes 162 and 164, and it is possible to enhance the reliability. In addition, in the first modification example, the other first movable comb electrode 162 is located on the movable mirror 11 side with respect to the center A of the lever 141 in the X-axis direction. According to this, it is possible to secure a distance from a connection position with respect to the base 12 in the first elastic support unit 14 to the other first movable comb electrode 162. In addition, the other first movable comb electrode 164 is located on the movable mirror 11 side with respect to the center B of the lever 151 in the X-axis direction. According to this, it is possible to secure a distance from a connection position with respect to the base 12 in the second elastic support unit 15 to the other first movable comb electrode 164. As a result, it is possible to efficiently use the electrostatic force that occurs between the first fixed comb electrodes 161 and the first movable comb electrodes 162 and between the first fixed comb electrodes 163 and the first movable comb electrodes 164 as a driving force of the movable mirror 11.

In addition, in the first modification example, the pair of the electrode support portions 147 and the pair of the electrode support portions 157 are disposed to be aligned along the X-axis direction. According to this, a plurality of the electrode support portions 147 and 157 are provided, and thus it is possible to secure the driving force. In the first modification example, distortion of the electrode support portions 147 and 157 which support the first movable comb electrodes 162 and 164 is suppressed by increasing the thickness of the electrode support portions 147 and 157 instead of a width thereof, and thus the plurality of electrode support portions 147 and 157 can be disposed to be aligned along the X-axis direction. Three or more electrode support portions may be provided in one piece of the lever 141. This is also true of the lever 151.

Figure 8:
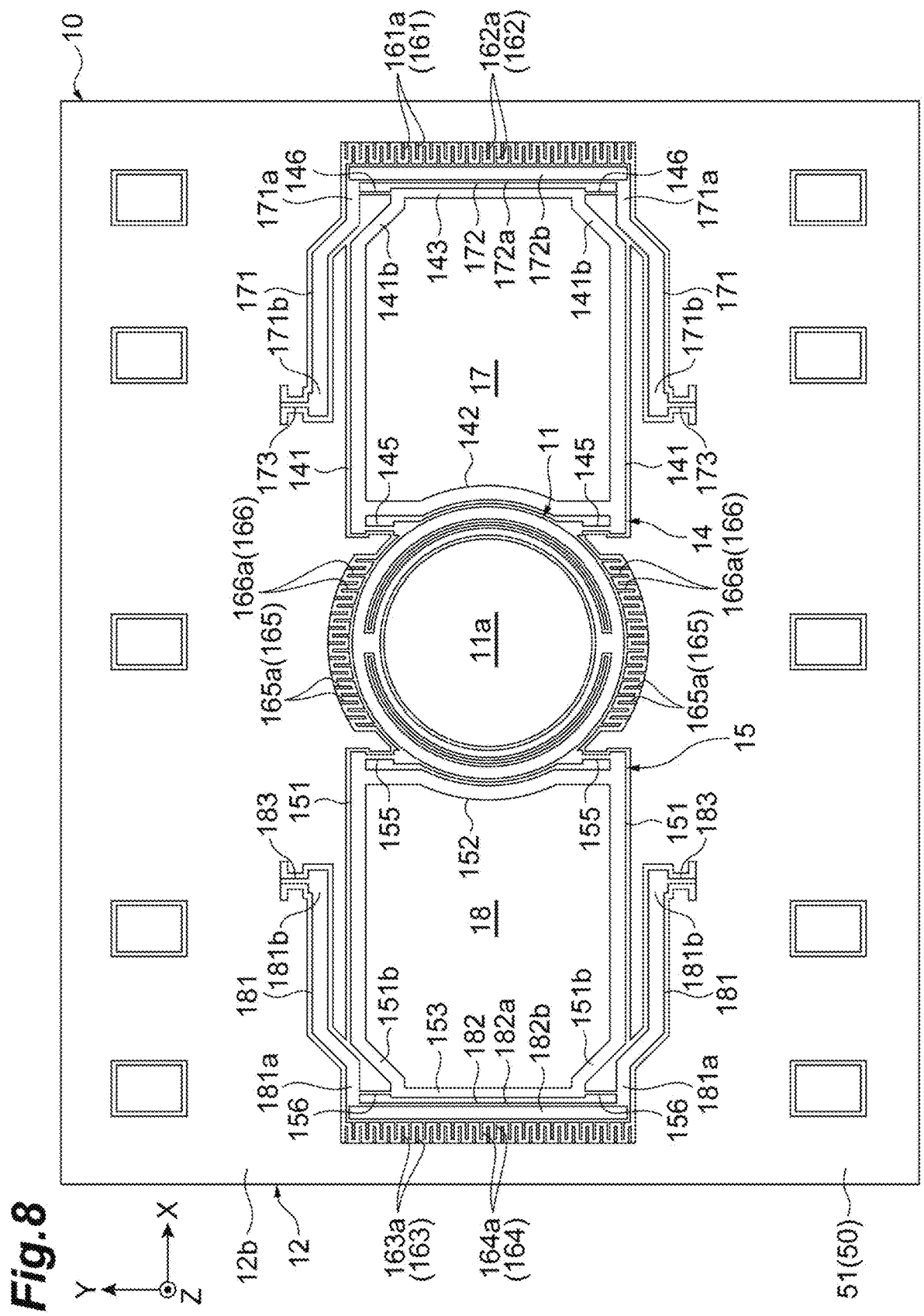
FIG. 8 is a plan view illustrating an optical device according to a second modification example.

The optical device 10 may be constituted as in a second modification example illustrated in FIG. 8. In the second modification example, the first elastic support unit 14 includes a pair of levers 141, a link 142, a link 143, a pair of first torsion bars 145, a pair of second torsion bars 146, a pair of second levers 171, a link 172, and a pair of third torsion bars 173. In each of the levers 141, an end 141b has a shape that is curved toward the first optical function unit 17 side. The pair of second levers 171 are respectively disposed on both sides of the levers 141 in the Y-axis direction. Each of the second levers 171 has a plate shape that extends along a plane perpendicular to the Z-axis direction, and extends along each of the levers 141.

The link 172 bridges ends 171a of the pair of second levers 171 on a side opposite to the movable mirror 11. The link 172 has a plate shape that extends along a plane perpendicular to the Z-axis direction, and extends along the Y-axis direction. The link 172 is disposed on a side opposite to the first optical function unit 17 with respect to the link 143, and extends along the link 143. The pair of second torsion bars 146 respectively bridge the end 141b of one of the levers 141 and the end 171a of one of the second levers 171, and the end 141b of the other lever 141 and the end 171a of the other second lever 171. The pair of third torsion bars 173 respectively bridge an end 171b on the movable mirror 11 side in one of the second levers 171 and the base 12, and an end 171b on the movable mirror 11 side in the other second lever 171 and the base 12.

A first movable comb electrode 162 including a plurality of first movable comb fingers 162a is provided on a surface of the link 172 on a side opposite to the first optical function unit 17. That is, the link 172 constitutes an electrode support portion that supports the first movable comb electrode 162. Each of the links 172 includes an eighth main body portion 172a and an eighth rib portion 172b. The eighth main body portion 172a is formed by a part of the device layer 52. The first movable comb electrode 162 extends from the eighth main body portion 172a. The eighth rib portion 172b is formed by a part of the support layer 51 and the intermediate layer 53. The eighth rib portion 172b is provided on a surface of the eighth main body portion 172a on the main surface 12b side.

The eighth rib portion 172b is formed so that the thickness of the link 172 in the Z-axis direction is larger than the thickness of the first movable comb fingers 162a in the Z-axis direction. The eighth rib portion 172b extends between both ends of the link 172 along the Y-axis direction. An edge of the eighth rib portion 172b on one side in the X-axis direction extends along an edge of the link 172 on the one side in the X-axis direction with a predetermined interval from the edge when viewed from the Z-axis direction. An edge of the eighth rib portion 172b on the other side in the X-axis direction extends along an edge of the link 172 on the other side in the X-axis direction with a predetermined interval from the edge when viewed from the Z-axis direction.

The second elastic support unit 15 includes a pair of levers 151, a link 152, a link 153, a pair of first torsion bars 155, a pair of second torsion bars 156, a pair of second levers 181, a link 182, and a pair of third torsion bars 183. In each of the levers 151, an end 151b has a shape that is curved toward the second optical function unit 18 side. The pair of second levers 181 are respectively disposed on both sides of the levers 151 in the Y-axis direction. Each of the second levers 181 has a plate shape that extends along a plane perpendicular to the Z-axis direction, and extends along each of the levers 151.

The link 182 bridges ends 181a of the pair of second levers 181 on a side opposite to the movable mirror 11. The link 182 has a plate shape that extends along a plane perpendicular to the Z-axis direction, and extends along the Y-axis direction. The link 182 is disposed on a side opposite to the second optical function unit 18 with respect to the link 153, and extends along the link 153. The pair of second torsion bars 156 respectively bridge the end 151b of one of the levers 151 and the end 181a of one of the second levers 181, and the end 151b of the other lever 151 and the end 181a of the other second lever 181. The pair of third torsion bars 183 respectively bridge an end 181b on the movable mirror 11 side in one of the second levers 181 and the base 12, and an end 181b on the movable mirror 11 side in the other second lever 181 and the base 12.

A first movable comb electrode 164 including a plurality of first movable comb fingers 164a is provided on a surface of the link 182 on a side opposite to the second optical function unit 18. That is, the link 182 constitutes an electrode support portion that supports the first movable comb electrode 164. Each of the links 182 includes a ninth main body portion 182a and a ninth rib portion 182b. The ninth main body portion 182a is formed by a part of the device layer 52. The first movable comb electrode 164 extends from the ninth main body portion 182a. The ninth rib portion 182b is fainted by a part of the support layer 51 and the intermediate layer 53. The ninth rib portion 182b is provided on a surface of the ninth main body portion 182a on the main surface 12b side.

The ninth rib portion 182b is formed so that the thickness of the link 182 in the Z-axis direction is larger than the thickness of the first movable comb fingers 164a in the Z-axis direction. The ninth rib portion 182b extends between both ends of the link 182 along the Y-axis direction. An edge of the ninth rib portion 182b on one side in the X-axis direction extends along an edge of the link 182 on the one side in the X-axis direction with a predetermined interval from the edge when viewed from the Z-axis direction. An edge of the ninth rib portion 182b on the other side in the X-axis direction extends along an edge of the link 182 on the other side in the X-axis direction with a predetermined interval from the edge when viewed from the Z-axis direction.

According to the second modification example, as in the embodiment, it is possible to suppress fluctuation of an interval between the first movable comb electrodes 162 and 164 and the second movable comb electrode 166, and the first fixed comb electrodes 161 and 163 and the second fixed comb electrode 165, and it is possible to enhance the reliability. Particularly, in the second modification example, it is possible to suppress fluctuation of the interval between the first movable comb electrodes 162 and 164 and the first fixed comb electrodes 161 and 163 by the link 172 that bridges the pair of second levers 171 and the link 182 that bridges the pair of second levers 181.

Figure 9:
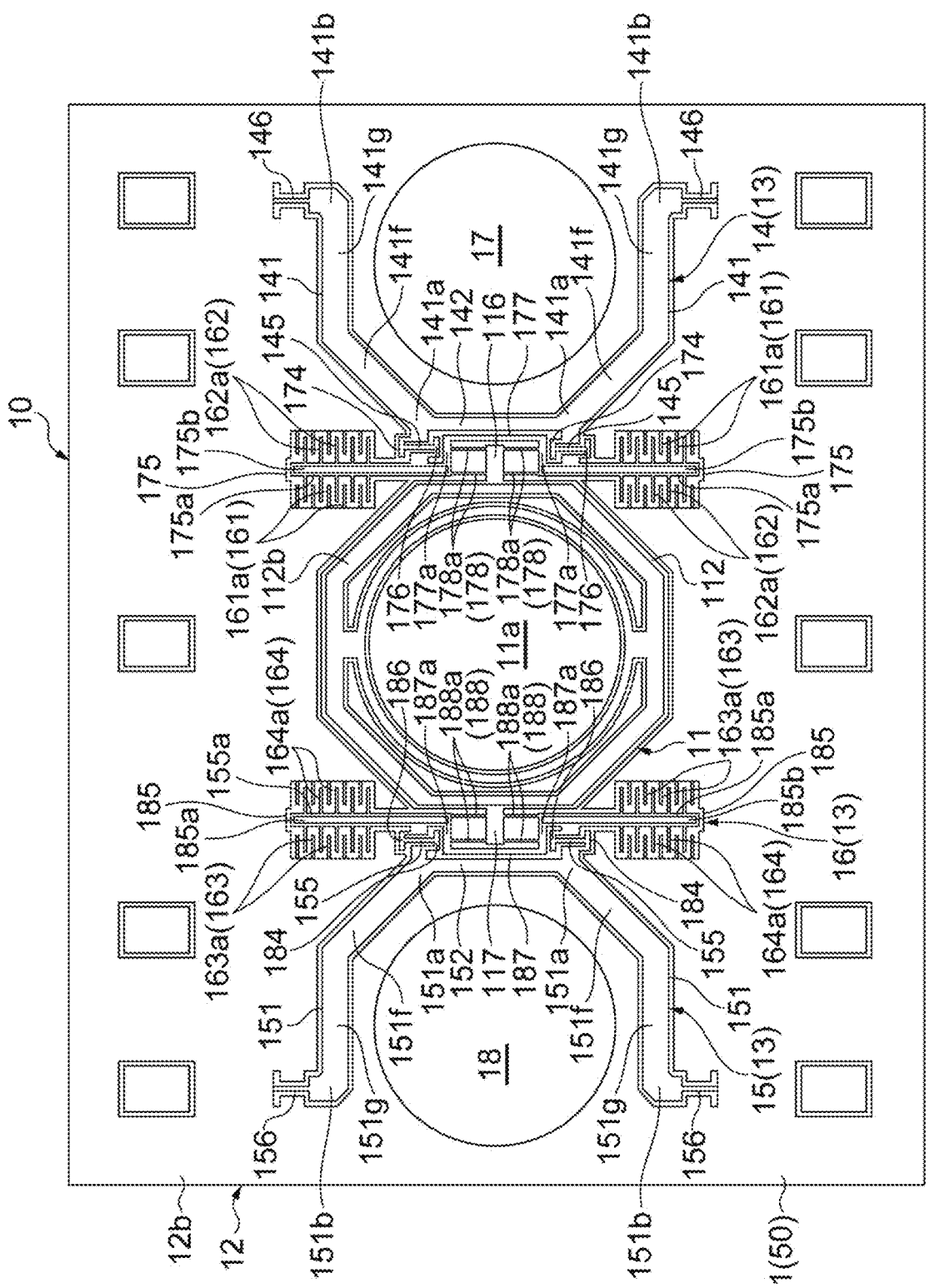
FIG. 9 is a plan view illustrating an optical device according to a third modification example.

The optical device 10 may be constituted as in a third modification example illustrated in FIG. 9. In the third modification example, the second fixed comb electrode 165 and the second movable comb electrode 166 are not provided. The frame portion 112 has an octagonal ring shape when viewed from the Z-axis direction, and the second rib portion 112b has an octagonal ring shape when viewed from the Z-axis direction. The movable mirror 11 includes one bracket 116 and one bracket 117. The bracket 116 is provided on a surface of the frame portion 112 on the first optical function unit 17 side to protrude toward the first optical function unit 17 side. The bracket 117 is provided on a surface of the frame portion 112 on the second optical function unit 18 side to protrude toward the second optical function unit 18 side.

The first elastic support unit 14 includes a pair of levers 141, a link 142, a pair of first torsion bars 145, a pair of second torsion bars 146, a pair of brackets 174, a pair of extending portions 175, a pair of brackets 176, a link 177, and a pair of non-linearity mitigation springs 178. The pair of levers 141 respectively extend from the movable mirror 11 side to both sides of the first optical function unit 17 in the Y-axis direction along a plane that is perpendicular to the Z-axis direction.

Each of the levers 141 includes a first portion 141f that is disposed on the movable mirror 11 side, and a second portion 141g that is disposed on a side opposite to the movable mirror 11 with respect to the first portion 141f. In the pair of levers 141, the first portions 141f obliquely extend to be spaced away from each other as going away from the movable mirror 11. The second portion 141g extends along the X-axis direction. The pair of brackets 174 are respectively provided on surfaces of the first portions 141f on the movable mirror 11 side to protrude toward the movable mirror 11 side. The brackets 174 have a shape curved in a crank shape toward the same side when viewed from the Z-axis direction.

The extending portions 175 have a rectangular shape when viewed from the Z-axis direction. One of the extending portions 175 extends between one of the levers 141 and the movable mirror 11, and protrudes to an outer side in comparison to the movable mirror 11 in the Y-axis direction. The other extending portion 175 extends between the other lever 141 and the movable mirror 11, and protrudes to an outer side in comparison to the movable mirror 11 in the Y-axis direction. The pair of extending portions 175 are disposed on the same central line parallel to the Y-axis direction when viewed from the Z-axis direction.

A first movable comb electrode 162 including a plurality of first movable comb fingers 162a is provided on surfaces of the extending portions 175 on both sides in the X-axis direction. That is, the extending portions 175 constitute an electrode support portion that supports the first movable comb electrodes 162. Each of the extending portions 175 includes a tenth main body portion 175a and a tenth rib portion 175b. The tenth main body portion 175a is formed by a part of the device layer 52. The first movable comb electrode 162 extends from the tenth main body portion 175a. The tenth rib portion 175b is formed by a part of the support layer 51 and the intermediate layer 53. The tenth rib portion 175b is provided on a surface of the tenth main body portion 175a on the main surface 12b side.

The tenth rib portion 175b is formed so that the thickness of the extending portion 175 in the Z-axis direction is larger than the thickness of the first movable comb fingers 162a in the Z-axis direction. The tenth rib portion 175b extends between both ends of the extending portion 175 along the Y-axis direction. An edge of the tenth rib portion 175b on one side in the X-axis direction extends along an edge of the extending portion 175 on the one side in the X-axis direction with a predetermined interval from the edge when viewed from the Z-axis direction. An edge of the tenth rib portion 175b on the other side in the X-axis direction extends along an edge of the extending portion 175 on the other side in the X-axis direction with a predetermined interval from the edge when viewed from the Z-axis direction.

The pair of brackets 176 are respectively provided on surfaces of the extending portions 175 on the first optical function unit 17 side to protrude toward the first optical function unit 17 side. The brackets 176 have a shape that is curved in a crank shape to the same side (however, a side opposite to each of the brackets 174) when viewed from the Z-axis direction. A tip end of one of the brackets 176 faces a tip end of one of the brackets 174 in the Y-axis direction. A tip end of the other bracket 176 faces a tip end of the other bracket 174 in the Y-axis direction.

The link 177 bridges inner ends of the pair of extending portions 175. The link 177 has an approximately U-shape that is opened toward the movable mirror 11 side when viewed from the Z-axis direction. The link 177 faces the bracket 116 of the movable mirror 11 in the Y-axis direction. More specifically, the link 177 includes a pair of side portions 177a which extend in the X-axis direction and face each other in the Y-axis direction, and the bracket 116 is disposed between the pair of side portions 177a.

The pair of first torsion bars 145 respectively bridge a tip end of one of the brackets 174 and a tip end of one of the brackets 176, and a tip end of the other bracket 174 and a tip end of the other bracket 176. The pair of second torsion bars 146 respectively bridge an end 141b of one of the levers 141 and the base 12, and an end 141b of the other lever 141 and the base 12.

The pair of non-linearity mitigation springs 178 are respectively disposed on one side and on the other side in the Y-axis direction, with respect to the bracket 116. The non-linearity mitigation springs 178 are connected to the movable mirror 11 through the bracket 116, and are respectively connected to the first torsion bars 145 through the link 177, the extending portions 175, and the brackets 176. That is, the non-linearity mitigation springs 178 are connected between the movable mirror 11 and the first torsion bars 145. Each of the non-linearity mitigation springs 178 includes a pair of plate-shaped portions 178a which bridge the bracket 116 and the pair of side portions 177a of the link 177.

The plate-shaped portions 178a have a flat plate shape perpendicular to the X-axis direction. In one of the non-linearity mitigation springs 178, the pair of plate-shaped portions 178a face each other in the X-axis direction. In the pair of non-linearity mitigation springs 178, the plate-shaped portion 178a located on one side in the X-axis direction is disposed along one plane perpendicular to the X-axis direction, and the plate-shaped portion 178a located on the other side in the X-axis direction is disposed along another plane perpendicular to the X-axis direction.

A length of each of the plate-shaped portions 178a (a length in the Y-axis direction) is longer than a length of the first torsion bars 145 and a length of the second torsion bars 146. A width of each of the plate-shaped portions 178a (a length in the X-axis direction) is narrower than a width of the first torsion bars 145 and a width of the second torsion bars 146. The non-linearity mitigation springs 178 are constituted so that a deformation amount of the non-linearity mitigation springs 178 around the Y-axis direction is smaller than a deformation amount of each of the first torsion bars 145 and the second torsion bars 146 around the Y-axis direction, and a deformation amount of the non-linearity mitigation springs 178 in the X-axis direction is larger than a deformation amount of each of the first torsion bars 145 and the second torsion bars 146 in the X-axis direction in a state in which the movable mirror 11 has moved in the Z-axis direction. The deformation amount of the first torsion bars 145, the second torsion bars 146, and the non-linearity mitigation springs 178 around the Y-axis direction represents, for example, an absolute value of a twist amount (a twist angle). The deformation amount of the first torsion bars 145, the second torsion bars 146, and the non-linearity mitigation springs 178 in the X-axis direction represents, for example, an absolute value of a bending amount. In a case where an end of the plate-shaped portions 178a at least on the bracket 116 side and on the side portion 177a side is provided with a widened portion of which a width increases as approaching the end, a length of the plate-shaped portion 178a represents a length of the plate-shaped portion 178a excluding the widened portion, and a width of the plate-shaped portion 178a represents a width of the plate-shaped portion 178a excluding the widened portion. This is also true of each of the first torsion bars 145 and 155, the second torsion bars 146 and 156, and a plate-shaped portion 188a to be described later.

The second elastic support unit 15 includes a pair of levers 151, a link 152, a pair of first torsion bars 155, a pair of second torsion bars 156, a pair of brackets 184, a pair of extending portions 185, a pair of brackets 186, a link 187, and a pair of non-linearity mitigation springs 188. The pair of levers 151 respectively extend from the movable mirror 11 side to both sides of the second optical function unit 18 in the Y-axis direction along a plane that is perpendicular to the Z-axis direction.

Each of the levers 151 includes a first portion 151f that is disposed on the movable mirror 11 side, and a second portion 151g that is disposed on a side opposite to the movable mirror 11 with respect to the first portion 151f. In the pair of levers 151, the first portions 151f obliquely extend to be spaced away from each other as going away from the movable mirror 11. The second portion 151g extends along the X-axis direction. The pair of brackets 184 are respectively provided on surfaces of the first portions 151f on the movable mirror 11 side to protrude toward the movable mirror 11 side. The brackets 184 have a shape curved in a crank shape toward the same side (however, a side opposite to the brackets 174) when viewed from the Z-axis direction.

The extending portions 185 have a rectangular shape when viewed from the Z-axis direction. One of the extending portions 185 extends between one of the levers 151 and the movable mirror 11, and protrudes to an outer side in comparison to the movable mirror 11 in the Y-axis direction. The other extending portion 185 extends between the other lever 151 and the movable mirror 11, and protrudes to an outer side in comparison to the movable mirror 11 in the Y-axis direction. The pair of extending portions 185 are disposed on the same central line parallel to the Y-axis direction when viewed from the Z-axis direction.

A first movable comb electrode 164 including a plurality of first movable comb fingers 164a is provided on surfaces of the extending portions 185 on both sides in the X-axis direction. That is, the extending portions 185 constitute an electrode support portion that supports the first movable comb electrodes 164. Each of the extending portions 185 includes an eleventh main body portion 185a and an eleventh rib portion 185b. The eleventh main body portion 185a is formed by a part of the device layer 52. The first movable comb electrode 164 extends from the eleventh main body portion 185a. The eleventh rib portion 185b is formed by a part of the support layer 51 and the intermediate layer 53.

The eleventh rib portion 185b is provided on a surface of the eleventh main body portion 185a on the main surface 12b side.

The eleventh rib portion 185b is formed so that the thickness of the extending portion 185 in the Z-axis direction is larger than the thickness of the first movable comb fingers 164a in the Z-axis direction. The eleventh rib portion 185b extends between both ends of the extending portion 185 along the Y-axis direction. An edge of the eleventh rib portion 185b on one side in the X-axis direction extends along an edge of the extending portion 185 on the one side in the X-axis direction with a predetermined interval from the edge when viewed from the Z-axis direction. An edge of the eleventh rib portion 185b on the other side in the X-axis direction extends along an edge of the extending portion 185 on the other side in the X-axis direction with a predetermined interval from the edge when viewed from the Z-axis direction.

The pair of brackets 186 are respectively provided on surfaces of the extending portions 185 on the second optical function unit 18 side to protrude toward the second optical function unit 18 side. The brackets 186 have a shape that is curved in a crank shape to the same side (however, a side opposite to each of the brackets 184) when viewed from the Z-axis direction. A tip end of one of the brackets 186 faces a tip end of one of the brackets 184 in the Y-axis direction. A tip end of the other bracket 186 faces a tip end of the other bracket 184 in the Y-axis direction.

The link 187 bridges inner ends of the pair of extending portions 185. The link 187 has an approximately U-shape that is opened toward the movable mirror 11 side when viewed from the Z-axis direction. The link 187 faces the bracket 117 of the movable mirror 11 in the Y-axis direction. More specifically, the link 187 includes a pair of side portions 187a which extend in the X-axis direction and face each other in the Y-axis direction, and the bracket 117 is disposed between the pair of side portions 187a.

The pair of first torsion bars 155 respectively bridge a tip end of one of the brackets 184 and a tip end of one of the brackets 186, and a tip end of the other bracket 184 and a tip end of the other bracket 186. The pair of second torsion bars 156 respectively bridge an end 151b of one of the levers 151 and the base 12, and an end 151b of the other lever 151 and the base 12.

The pair of non-linearity mitigation springs 188 are respectively disposed on one side and on the other side in the Y-axis direction with respect to the bracket 117. The non-linearity mitigation springs 188 are connected to the movable mirror 11 through the bracket 117, and are respectively connected to the first torsion bars 155 through the link 187, the extending portions 185, and the brackets 186. That is, the non-linearity mitigation springs 188 are connected between the movable mirror 11 and the first torsion bars 155. Each of the non-linearity mitigation springs 188 includes a pair of plate-shaped portions 188a which bridge the bracket 117 and the pair of side portions 187a of the link 187.

The plate-shaped portions 188a have a flat plate shape perpendicular to the X-axis direction. In one of the non-linearity mitigation springs 188, the pair of plate-shaped portions 188a face each other in the X-axis direction. In the pair of non-linearity mitigation springs 188, the plate-shaped portion 188a located on one side in the X-axis direction is disposed along one plane perpendicular to the X-axis direction, and the plate-shaped portion 188a located on the other side in the X-axis direction is disposed along another plane perpendicular to the X-axis direction.

For example, the plate-shaped portions 188a are formed in the same shape as in the plate-shaped portions 178a. A length of each of the plate-shaped portions 188a is longer than a length of the first torsion bars 155 and a length of the second torsion bars 156. A width of each of the plate-shaped portions 188a is narrower than a width of the first torsion bars 155 and a width of the second torsion bars 156. The non-linearity mitigation springs 188 are constituted so that a deformation amount of the non-linearity mitigation springs 188 around the Y-axis direction is smaller than a defamation amount of each of the first torsion bars 155 and the second torsion bars 156 around the Y-axis direction, and a deformation amount of the non-linearity mitigation springs 188 in the X-axis direction is larger than a deformation amount of each of the first torsion bars 155 and the second torsion bars 156 in the X-axis direction in a state in which the movable mirror 11 has moved in the Z-axis direction.

Each of the first optical function unit 17 and the second optical function unit 18 is a light passage opening that is formed in the SOI substrate 50. Each of the first optical function unit 17 and the second optical function unit 18 has a circular shape when viewed from the Z-axis direction.

According to the third modification example, as in the embodiment, it is possible to suppress fluctuation of the interval between the first movable comb electrodes 162 and 164, and the first fixed comb electrodes 161 and 163, and it is possible to enhance the reliability. Particularly, in the third modification example, it is possible to suppress fluctuation of the interval between the first movable comb electrodes 162 and 164, and the first fixed comb electrodes 161 and 163 by the extending portion 175 that extends between the lever 141 and the movable mirror 11 when viewed from the Z-axis direction, and the extending portion 185 that extends between the lever 151 and the movable mirror 11 when viewed from the Z-axis direction. In addition, since the first elastic support unit 14 includes the non-linearity mitigation springs 178 and the second elastic support unit 15 includes the non-linearity mitigation springs 188, it is possible to suppress non-linearity from occurring in twist deformation of the first torsion bars 145 and 155 and the second torsion bars 146 and 156. In addition, in the configuration in which the non-linearity mitigation springs 178 and 188 are provided as described above, it is possible to suppress fluctuation of the interval between the first movable comb electrodes 162 and 164 and the first fixed comb electrodes 161 and 163.

Figure 10:
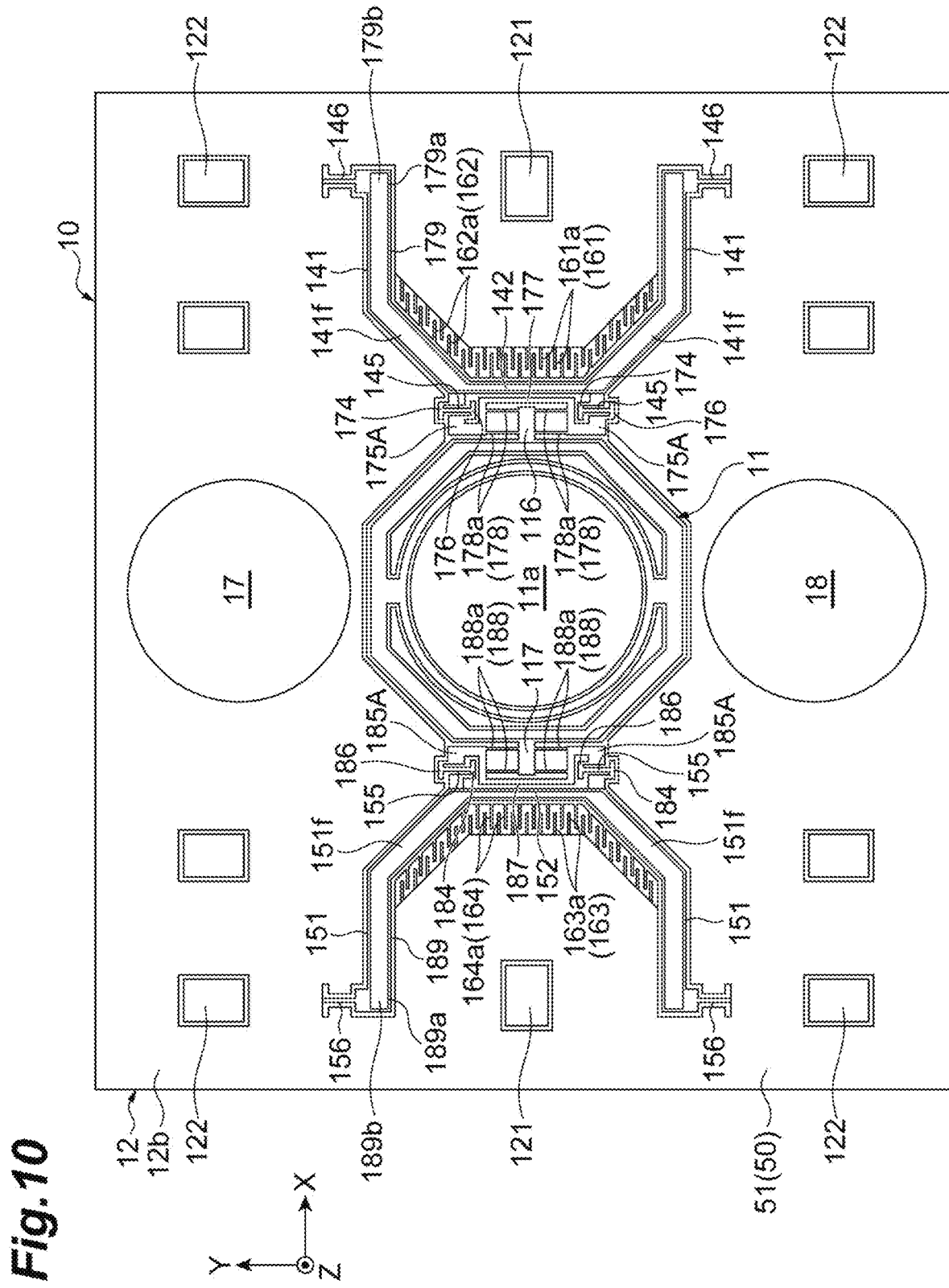
FIG. 10 is a plan view illustrating an optical device according to a fourth modification example.

The optical device 10 may be constituted as in a fourth modification example illustrated in FIG. 10. The fourth modification example is different from the third modification example in the following configuration. In the fourth modification example, the first movable comb electrode 162 is disposed along the first portions 141f in the pair of levers 141 and the link 142. That is, the pair of levers 141 and the link 142 constitute an electrode support portion that supports the first movable comb electrode 162. Hereinafter, the pair of levers 141 and the link 142 may be noted as an electrode support portion 179. The first movable comb electrode 164 is disposed along the first portions 151f in the pair of levers 151, and the link 152. That is, the pair of levers 151 and the link 152 constitute an electrode support portion that supports the first movable comb electrode 164. Hereinafter, the pair of levers 141 and the link 142 may be noted as an electrode support portion 189.

A pair of intermediate portions 175A are provided instead of the pair of extending portions 175. The intermediate portions 175A are respectively connected to the levers 141 through the brackets 174 and 176, and the first torsion bars 145, and are connected to the bracket 116 through the link 177 and the non-linearity mitigation springs 178. A pair of intermediate portions 185A are provided instead of the pair of extending portions 185. The intermediate portions 185A are respectively connected to the levers 151 through the brackets 184 and 186, and the first torsion bars 155, and are connected to the bracket 117 through the link 187 and the non-linearity mitigation springs 188. When viewed from the Z-axis direction, the first optical function unit 17 is disposed on one side of the movable mirror 11 in the Y-axis direction, and the second optical function unit 18 is disposed on the other side of the movable mirror 11 in the Y-axis direction.

A first movable comb electrode 162 including a plurality of first movable comb fingers 162a is provided on a surface of the electrode support portion 179 on a side opposite to the movable mirror 11. Each of the electrode support portions 179 includes a twelfth main body portion 179a and a twelfth rib portion 179b. The twelfth main body portion 179a is formed by a part of the device layer 52. The first movable comb electrode 162 extends from the twelfth main body portion 179a. The twelfth rib portion 179b is formed by a part of the support layer 51 and the intermediate layer 53. The twelfth rib portion 179b is provided on a surface of the twelfth main body portion 179a on the main surface 12b side.

The twelfth rib portion 179b is formed so that the thickness of the electrode support portion 179 in the Z-axis direction is larger than the thickness of the first movable comb fingers 162a in the Z-axis direction. The twelfth rib portion 179b extends between both ends of the electrode support portions 179. An edge of the twelfth rib portion 179b on one side in the X-axis direction extends along an edge of the electrode support portion 179 on the one side in the X-axis direction with a predetermined interval from the edge when viewed from the Z-axis direction. An edge of the twelfth rib portion 179b on the other side in the X-axis direction extends along an edge of the electrode support portion 179 on the other side in the X-axis direction with a predetermined interval from the edge when viewed from the Z-axis direction.

A first movable comb electrode 164 including a plurality of first movable comb fingers 164a is provided on a surface of the electrode support portion 189 on a side opposite to the movable mirror 11. Each of the electrode support portions 189 includes a thirteenth main body portion 189a and a thirteenth rib portion 189b. The thirteenth main body portion 189a is formed by a part of the device layer 52. The first movable comb electrode 164 extends from the thirteenth main body portion 189a. The thirteenth rib portion 189b is formed by a part of the support layer 51 and the intermediate layer 53. The thirteenth rib portion 189b is provided on a surface of the thirteenth main body portion 189a on the main surface 12b side.

The thirteenth rib portion 189b is formed so that the thickness of the electrode support portion 189 in the Z-axis direction is larger than the thickness of the first movable comb fingers 164a in the Z-axis direction. The thirteenth rib portion 189b extends between both ends of the electrode support portions 189. An edge of the thirteenth rib portion 189b on one side in the X-axis direction extends along an edge of the electrode support portion 189 on the one side in the X-axis direction with a predetermined interval from the edge when viewed from the Z-axis direction. An edge of the thirteenth rib portion 189b on the other side in the X-axis direction extends along an edge of the electrode support portion 189 on the other side in the X-axis direction with a predetermined interval from the edge when viewed from the Z-axis direction.

According to the fourth modification example, as in the embodiment, it is possible to suppress fluctuation of the interval between the first movable comb electrodes 162 and 164, and the first fixed comb electrodes 161 and 163, and it is possible enhance to the reliability. Particularly, in the fourth modification example, it is possible to suppress fluctuation of the interval between the first movable comb electrodes 162 and 164, and the first fixed comb electrodes 161 and 163 by the electrode support portions 179 and 189.

Figure 11:
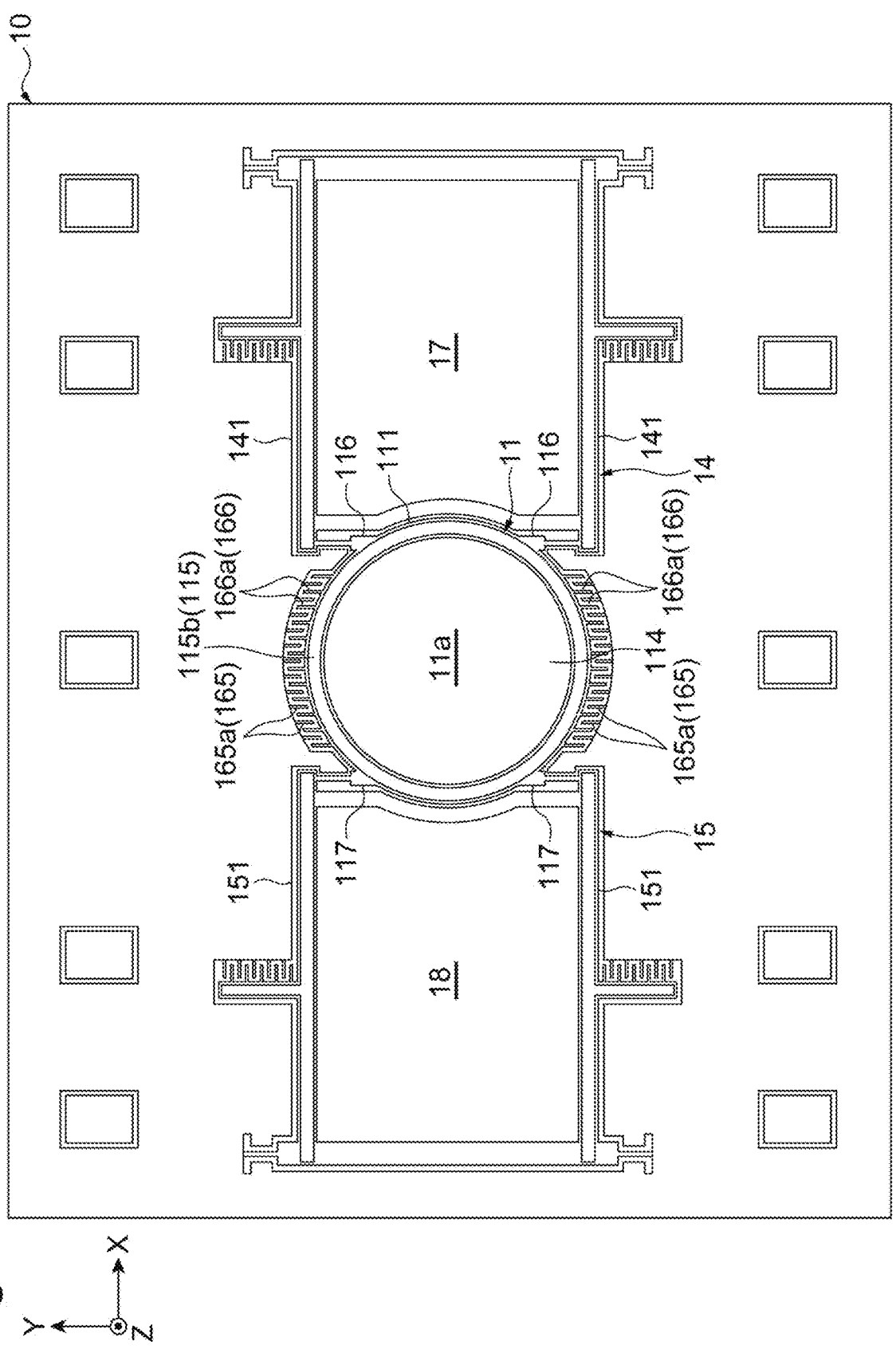
FIG. 11 is a plan view illustrating an optical device according to a fifth modification example.

The optical device 10 may be constituted as in a fifth modification example illustrated in FIG. 11. In the fifth modification example, the frame portion 112 and the connection portion 113 are not provided, and the brackets 116 and 117 are directly connected to the main body portion 111. A pair of second movable comb electrodes 166 are provided on an outer surface of the outer edge portion 115 of the main body portion 111 in the Y-axis direction. That is, in the fifth modification example, the outer edge portion 115 constitutes an electrode support portion that supports the second movable comb electrodes 166. As described above, the outer edge portion 115 includes the first rib portion 115b that is formed so that the thickness of the outer edge portion 115 in the Z-axis direction is larger than the thickness of the central portion 114 in the Z-axis direction.

According to the fifth modification example, as in the embodiment, it is possible to suppress fluctuation of an interval between the first movable comb electrodes 162 and 164 and the second movable comb electrode 166, and the first fixed comb electrodes 161 and 163 and the second fixed comb electrode 165, and it is possible enhance to the reliability. Particularly, in the fifth modification example, it is possible to suppress fluctuation of the interval between the second movable comb electrode 166 and the second fixed comb electrode 165 by the outer edge portion 115 of which the thickness in the Z-axis direction is larger than the thickness of the central portion 114.

In the embodiment and the modification examples, the first fixed comb electrodes 161 and 163 and the first movable comb electrodes 162 and 164 (hereinafter, noted as a first electrode) are described to be used as an electrode for driving, and the second fixed comb electrode 165 and the second movable comb electrode 166 (hereinafter, noted as a second electrode) are described to be used as an electrode for monitoring, but the first electrode may be used as the electrode for monitoring and the second electrode may be used as the electrode for driving. The second electrode may be omitted, and only the first electrode may be provided. In this case, the first electrode may be used as the electrode for driving, or may be used as an electrode for driving and monitoring. The first electrode may be omitted, and only the second electrode may be provided. In this case, the second electrode may be used as the electrode for driving, or may be used as an electrode for driving and monitoring.

In the embodiment and the modification examples, materials and shapes of respective configurations are not limited to the above-described materials and shapes, and various materials and shapes can be employed. For example, each of the main body portion 111 and the mirror surface 11a may have any shape such as a rectangular shape and an octagonal shape when viewed from the Z-axis direction. The frame portion 112 may have any ring shape such as a rectangular ring shape and an octagonal ring shape when viewed from the Z-axis direction.

Each of the first rib portion 115b, the second rib portion 112b, the third rib portion 113b, the fourth rib portion 141e, the fifth rib portion 147b, the sixth rib portion 151e, and the seventh rib portion 157b (beam portions) may be formed in any shape. For example, the rib portions may extend obliquely with respect to X-axis direction or the Y-axis direction, or may extend in a zigzag shape. The arrangement, the number, the length, the width, and the thickness of the rib portions may be arbitrarily set. At least one of the rib portions may be omitted. In the embodiment, the first rib portion 115b is provided on a surface of the first main body portion 115a on the main surface 12b side, but the first rib portion 115b may be provided on a surface of the first main body portion 115a on the main surface 12a side. This is also true of other rib portions. The shape of the first torsion bars 145 and 155, and the second torsion bars 146 and 156 is not limited, and may be any shape such as a rod shape.

Each of the first optical function unit 17 and the second optical function unit 18 may have any shape such as a circular shape and an octagonal shape when viewed from the Z-axis direction. The optical device 10 may include a movable unit provided with another optical function unit other than the mirror surface 11a instead of the movable mirror 11. Examples of the other optical function unit include a lens. The actuator unit 16 is not limited to the electrostatic actuator, and may be, for example, a piezoelectric type actuator, an electromagnetic type actuator, or the like. The optical module 1 is not limited to constitute the FTIR, and may constitute another optical system.

REFERENCE SIGNS LIST

10: optical device, 11: movable mirror (movable unit), 11a: mirror surface (optical function unit), 12: base, 12a: main surface, 14: first elastic support unit, 15: second elastic support unit, 111: main body portion, 112: frame portion, 112b: second rib portion, 113: connection portion, 114: central portion, 115: outer edge portion, 115b: first rib portion, 141, 151: lever, 141e: fourth rib portion, 151e: sixth rib portion, 145, 155: first torsion bar (torsion support portion), 146, 156: second torsion bar (torsion support portion), 147, 157: electrode support portion, 147b: fifth rib portion, 157b: seventh rib portion, 161, 163: first fixed comb electrode, 161a, 163a: first fixed comb finger, 162, 164: first movable comb electrode, 162a, 164a: first movable comb finger, 165: second fixed comb electrode, 165a: second fixed comb finger, 166: second movable comb electrode, 166a: second movable comb finger, 171, 181: second lever, 172, 182: link, 172b: eighth rib portion, 182b: ninth rib portion, 175, 185: extending portion, 175b: tenth rib portion, 185b: eleventh rib portion, 178, 188: non-linearity mitigation spring, 179, 189: electrode support portion, 179b: twelfth rib portion, 189b: thirteenth rib portion.

The invention claimed is:

1. An optical device comprising:
a base that includes a main surface;
a movable unit that includes an optical function unit;
an elastic support unit that is connected between the base and the movable unit, and supports the movable unit so that the movable unit is movable along a predetermined direction perpendicular to the main surface;
a fixed comb electrode that is provided to the base and includes a plurality of fixed comb fingers; and
a movable comb electrode that is provided to at least one of the movable unit and the elastic support unit, and includes a plurality of movable comb fingers which are disposed alternately with the plurality of fixed comb fingers, wherein at least one of the movable unit and the elastic support unit includes an electrode support portion that supports the movable comb electrode, the plurality of movable comb fingers are directly connected to the electrode support portion, the electrode support portion has a thickness in the predetermined direction larger than a thickness of the movable comb fingers at a connection part where proximate ends of the movable comb fingers are connected to the electrode support portion, the electrode support portion includes a rib portion that is formed so that the thickness of the electrode support portion in the predetermined direction is larger than the thickness of the movable comb fingers in the predetermined direction, the elastic support unit includes a lever and a torsion support portion connected between the lever and the movable unit, the thickness of the electrode support portion in the predetermined direction is larger than a thickness of the torsion support portion in the predetermined direction, and the base, the movable unit, and the elastic support unit are formed by a same common layer.

2. The optical device according to claim 1, wherein the electrode support portion directly extends from the lever.

3. The optical device according to claim 2, wherein the movable comb electrode is located on a side opposite to the movable unit with respect to the center of the lever in an extending direction of the lever.

4. The optical device according to claim 2, wherein the movable comb electrode is located on the movable unit side with respect to the center of the lever in an extending direction of the lever.

5. The optical device according to claim 2, wherein the lever includes a rib portion that is formed so that the thickness of the lever in the predetermined direction is larger than the thickness of the movable comb fingers in the predetermined direction.

6. The optical device according to claim 1, wherein the electrode support portion is provided to the movable unit to be disposed along an outer edge of the movable unit.

7. The optical device according to claim 1, wherein the lever comprises a pair of levers and a link that bridges the pair of levers, and the electrode support portion is constituted by the link.

8. The optical device according to claim 1, wherein the lever comprises a pair of levers and a link that bridges the pair of levers, the electrode support portion is constituted by the pair of levers and the link, and the movable comb electrode is disposed across the pair of levers and the link.

9. The optical device according to claim 1, wherein the elastic support unit includes an extending portion that extends between the lever and the movable unit when viewed from the predetermined direction, and the electrode support portion is constituted by the extending portion.

10. An optical device comprising:

a base that includes a main surface;

a movable unit that includes an optical function unit;

an elastic support unit that is connected between the base and the movable unit, and supports the movable unit so that the movable unit is movable along a predetermined direction perpendicular to the main surface;

a fixed comb electrode that is provided to the base and includes a plurality of fixed comb fingers; and a movable comb electrode that is provided to at least one of the movable unit and the elastic support unit, and includes a plurality of movable comb fingers which are disposed alternately with the plurality of fixed comb fingers, wherein at least one of the movable unit and the elastic support unit includes an electrode support portion that supports the movable comb electrode, the electrode support portion includes a rib portion that is formed so that the thickness of the electrode support portion in the predetermined direction is larger than the thickness of the movable comb fingers in the predetermined direction, the elastic support unit includes a lever and a torsion support portion connected between the lever and the movable unit, the thickness of the electrode support portion in the predetermined direction is larger than a thickness of the torsion support portion in the predetermined direction, the electrode support portion extends from the lever, the elastic support unit includes a plurality of the electrode support portions which extend from the lever, and the plurality of electrode support portions are disposed to be aligned along an extending direction of the lever.

11. An optical device comprising:

a base that includes a main surface;

a movable unit that includes an optical function unit;

an elastic support unit that is connected between the base and the movable unit, and supports the movable unit so that the movable unit is movable along a predetermined direction perpendicular to the main surface;

a fixed comb electrode that is provided to the base and includes a plurality of fixed comb fingers; and a movable comb electrode that is provided to at least one of the movable unit and the elastic support unit, and includes a plurality of movable comb fingers which are disposed alternately with the plurality of fixed comb fingers, wherein at least one of the movable unit and the elastic support unit includes an electrode support portion that supports the movable comb electrode, wherein the electrode support portion includes a rib portion that is formed so that the thickness of the electrode support portion in the predetermined direction is larger than the thickness of the movable comb fingers in the predetermined direction, wherein the elastic support unit includes a lever, wherein the electrode support portion extends from the lever, and wherein the thickness T1 of the electrode support portion in the predetermined direction and the thickness T2 of the movable comb finger in the predetermined direction satisfy the following Expression (1), $$T1^3 \times W1/C1^3 \geq N \times T2^3 \times W2/C2^3 \qquad (1)$$

in Expression (1) described above,

W1: a width of the electrode support portion when viewed from the predetermined direction, C1: a length of the electrode support portion when viewed from the predetermined direction, N: the number of the movable comb fingers, W2: a width of the movable comb finger when viewed from the predetermined direction, and C2: a length of the movable comb finger when viewed from the predetermined direction.

12. An optical device comprising:

a base that includes a main surface;

a movable unit that includes an optical function unit;

an elastic support unit that is connected between the base and the movable unit, and supports the movable unit so that the movable unit is movable along a predetermined direction perpendicular to the main surface;

a fixed comb electrode that is provided to the base and includes a plurality of fixed comb fingers; and a movable comb electrode that is provided to at least one of the movable unit and the elastic support unit, and includes a plurality of movable comb fingers which are disposed alternately with the plurality of fixed comb fingers, wherein at least one of the movable unit and the elastic support unit includes an electrode support portion that supports the movable comb electrode, the electrode support portion includes a rib portion that is formed so that the thickness of the electrode support portion in the predetermined direction is larger than the thickness of the movable comb fingers in the predetermined direction, the elastic support unit includes a lever and a torsion support portion connected between the lever and the movable unit, the thickness of the electrode support portion in the predetermined direction is larger than a thickness of the torsion support portion in the predetermined direction, the electrode support portion is provided to the movable unit to be disposed along an outer edge of the movable unit, the movable unit includes a main body portion that is provided with the optical function unit, a frame portion that surrounds the main body portion when viewed from the predetermined direction, and a connection portion that connects the main body portion and the frame portion to each other, and the electrode support portion is constituted by the frame portion.

13. An optical device comprising:

a base that includes a main surface;

a movable unit that includes an optical function unit;

an elastic support unit that is connected between the base and the movable unit, and supports the movable unit so that the movable unit is movable along a predetermined direction perpendicular to the main surface;

a fixed comb electrode that is provided to the base and includes a plurality of fixed comb fingers; and a movable comb electrode that is provided to at least one of the movable unit and the elastic support unit, and includes a plurality of movable comb fingers which are disposed alternately with the plurality of fixed comb fingers, wherein at least one of the movable unit and the elastic support unit includes an electrode support portion that supports the movable comb electrode, wherein the electrode support portion includes a rib portion that is formed so that the thickness of the electrode support portion in the predetermined direction is larger than the thickness of the movable comb fingers in the predetermined direction, wherein the electrode support portion is provided to the movable unit to be disposed along an outer edge of the movable unit, wherein the movable unit includes a main body portion including a central portion provided with the optical function unit, and an outer edge portion, the electrode support portion is constituted by the outer edge portion, and the rib portion is formed so that the thickness of the outer edge portion in the predetermined direction is larger than the thickness of the central portion in the predetermined direction.

14. An optical device comprising:

a base that includes a main surface;

a movable unit that includes an optical function unit;

an elastic support unit that is connected between the base and the movable unit, and supports the movable unit so that the movable unit is movable along a predetermined direction perpendicular to the main surface;

a fixed comb electrode that is provided to the base and includes a plurality of fixed comb fingers; and a movable comb electrode that is provided to at least one of the movable unit and the elastic support unit, and includes a plurality of movable comb fingers which are disposed alternately with the plurality of fixed comb fingers, wherein at least one of the movable unit and the elastic support unit includes an electrode support portion that supports the movable comb electrode, wherein the electrode support portion includes a rib portion that is formed so that the thickness of the electrode support portion in the predetermined direction is larger than the thickness of the movable comb fingers in the predetermined direction, wherein the elastic support unit includes a torsion support portion that extends in a second direction perpendicular to the predetermined direction, and a non-linearity mitigation spring that is connected between the torsion support portion and the movable unit, and the non-linearity mitigation spring is constituted so that a deformation amount of the non-linearity mitigation spring around the second direction is smaller than a deformation amount of the torsion support portion around the second direction, and a deformation amount of the non-linearity mitigation spring in a third direction perpendicular to the predetermined direction and the second direction is larger than a deformation amount of the torsion support portion in the third direction in a state in which the movable unit has moved in the predetermined direction.

\* \* \* \* \*